(12) United States Patent
Maeda et al.

(10) Patent No.: US 10,411,129 B2
(45) Date of Patent: Sep. 10, 2019

(54) METHODS OF FABRICATING SEMICONDUCTOR DEVICES

(71) Applicant: Samsung Electronics Co., Ltd., Suwon-si, Gyeonggi-do (KR)

(72) Inventors: Shigenobu Maeda, Seongnam-si (KR); Tae-Yong Kwon, Hwasung-si (KR); Sang-Su Kim, Yongin-si (KR); Jae-Hoo Park, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/877,563

(22) Filed: Jan. 23, 2018

(65) Prior Publication Data

US 2018/0151736 A1 May 31, 2018

Related U.S. Application Data

(63) Continuation of application No. 15/224,313, filed on Jul. 29, 2016, now Pat. No. 9,893,186, which is a
(Continued)

(30) Foreign Application Priority Data

Aug. 7, 2014 (KR) .................. 10-2014-0101756

(51) Int. Cl.
*H01L 31/072* (2012.01)
*H01L 31/109* (2006.01)
(Continued)

(52) U.S. Cl.
CPC .... *H01L 29/7848* (2013.01); *H01L 21/02529* (2013.01); *H01L 21/02532* (2013.01);
(Continued)

(58) Field of Classification Search
CPC .............. H01L 29/7848; H01L 29/785; H01L 27/0924
(Continued)

(56) References Cited

U.S. PATENT DOCUMENTS 7,015,078 B1 3/2006 Xiang et al.
7,045,401 B2 5/2006 Lee et al.
(Continued)

FOREIGN PATENT DOCUMENTS

| CN | 101414632 A | 4/2009 |
| CN | 102468235 A | 5/2012 |
| JP | 2010-093012 | 4/2010 |

OTHER PUBLICATIONS

1st Office Action in Chinese Patent Application CN201510136837.3, dated Jan. 31, 2019.

*Primary Examiner* — Theresa T Doan
(74) *Attorney, Agent, or Firm* — Muir Patent Law, PLLC

(57) ABSTRACT

Methods of forming a semiconductor device may include forming a fin-type active pattern that extends in a first direction on a substrate, the fin-type active pattern including a lower pattern on the substrate and an upper pattern on the lower pattern. A field insulating layer is formed on the substrate, the sidewalls of the fin-type active pattern, and a portion upper pattern protruding further away from the substrate than a top surface of the field insulating layer. A dummy gate pattern that intersects the fin-type active pattern and that extends in a second direction that is different from the first direction is formed. The methods include forming dummy gate spacers on side walls of the dummy gate pattern, forming recesses in the fin-type active pattern on both sides of the dummy gate pattern and forming source and drain regions on both sides of the dummy gate pattern.

20 Claims, 45 Drawing Sheets

Related U.S. Application Data continuation of application No. 14/669,082, filed on Mar. 26, 2015, now Pat. No. 9,431,537.

(60) Provisional application No. 61/970,615, filed on Mar. 26, 2014.

(51) Int. Cl.

| | | |
|---|---|---|
| *H01L 29/78* | (2006.01) | |
| *H01L 21/8234* | (2006.01) | |
| *H01L 27/088* | (2006.01) | |
| *H01L 29/66* | (2006.01) | |
| *H01L 29/165* | (2006.01) | |
| *H01L 21/02* | (2006.01) | |
| *H01L 21/8238* | (2006.01) | |
| *H01L 27/092* | (2006.01) | |
| *H01L 29/08* | (2006.01) | |
| *H01L 29/16* | (2006.01) | |
| *H01L 29/161* | (2006.01) | |

(52) U.S. Cl.
CPC ........ *H01L 21/823431* (2013.01); *H01L 21/823437* (2013.01); *H01L 21/823814* (2013.01); *H01L 21/823821* (2013.01); *H01L 21/823878* (2013.01); *H01L 27/0886* (2013.01); *H01L 27/0922* (2013.01); *H01L 29/0847* (2013.01); *H01L 29/161* (2013.01); *H01L 29/165* (2013.01); *H01L 29/1608* (2013.01); *H01L 29/66545* (2013.01); *H01L 29/66636* (2013.01); *H01L 29/66795* (2013.01); *H01L 29/785* (2013.01); *H01L 27/0924* (2013.01)

(58) Field of Classification Search
USPC .................................................. 257/192
See application file for complete search history.

(56) References Cited

U.S. PATENT DOCUMENTS

| | | |
|---|---|---|
| 7,994,566 B2 | 8/2011 | Mouli |
| 8,420,467 B2 | 4/2013 | Izumida et al. |
| 8,610,241 B1 | 12/2013 | Hu et al. |
| 8,629,478 B2 | 1/2014 | Ko et al. |
| 2009/0026505 A1 | 1/2009 | Okano |
| 2013/0037869 A1 | 2/2013 | Okano |
| 2013/0049080 A1 | 2/2013 | Okano |
| 2013/0234204 A1 | 9/2013 | Kang et al. |
| 2013/0244392 A1 | 9/2013 | Oh et al. |
| 2013/0248942 A1 | 9/2013 | Okano |
| 2014/0252481 A1 | 9/2014 | Flachowsky et al. |
| 2015/0187571 A1* | 7/2015 | Fan ............... H01L 29/0653 257/401 |

* cited by examiner

METHODS OF FABRICATING SEMICONDUCTOR DEVICES

CROSS-REFERENCE TO RELATED APPLICATIONS

This application is a continuation of U.S. patent application Ser. No. 15/224,313, filed on Jul. 29, 2016, which is a continuation of U.S. patent application Ser. No. 14/669,082, filed on Mar. 26, 2015, which claims priority from U.S. Patent Application No. 61/970,615 filed on Mar. 26, 2014 and Korean Patent Application No. 10-2014-0101756 filed on Aug. 7, 2014 in the Korean Intellectual Property Office, the disclosures of which are hereby incorporated herein by reference in their entireties.

BACKGROUND

As one of the scaling techniques for increasing the density of semiconductor devices, a multi-gate transistor has been suggested. The multi-gate transistor is obtained by forming a fin or nanowire-shaped multi-channel active pattern (or silicon body) on a substrate and forming gates on the surface of the multi-channel active pattern.

As the feature size of metal oxide semiconductor (MOS) transistors is reduced, a gate and a channel formed under the gate are becoming shorter in length. The reduced length of the channel increases the scattering of electric charges and reduces the mobility of the electric charges in the channel. The reduced mobility of the electric charges can be an obstacle to improving a saturation current of a transistor.

Therefore, various researches are being conducted to increase the mobility of electric charges in a transistor with a reduced channel length.

SUMMARY

Aspects of the present inventive concept provide semiconductor devices in which the operating performance of a transistor is improved by using silicon carbide in a channel layer of a transistor. Some embodiments of the present inventive concept are directed to semiconductor devices that include a field insulating layer on a top surface of a substrate and including a trench defined therein that extends in a first direction and a fin-type active pattern extending from the top surface of the substrate and through the trench defined in the field insulating layer. The fin-type active pattern includes a first lower pattern that contacts the substrate and a first upper pattern that contacts the first lower pattern and protrudes further from the substrate than the field insulating layer. The first upper pattern includes a lattice modifying material that is different from the first lower pattern. The fin-type active pattern includes a first fin portion and a second fin portion that is on both sides of the first fin portion in the first direction. The device includes a first gate electrode intersecting the fin-type active pattern and extending in a second direction that is different from the first direction.

Some embodiments include first source and drain regions that include impurity regions in the second fin portion and on both sides of the first gate electrode and a first epitaxial layer including the lattice modifying material. In some embodiments, the first epitaxial layer is formed on sidewalls and a top surface of the second portion of the first upper pattern and the first epitaxial layer contacts the field insulating layer. Some embodiments provide that the first epitaxial layer is formed on sidewalls and a top surface of the second portion of the first upper pattern without contacting the field insulating layer. Some embodiments include first gate spacers that are on sidewalls of the first gate electrode and first fin spacers that are on a portion of the sidewalls of the second portion of the first upper pattern and that contact the first epitaxial layer and the first gate spacers.

In some embodiments, the semiconductor device comprises an n-channel metal oxide semiconductor (NMOS), the lattice modifying material comprises carbon, and the first upper pattern comprises silicon carbide (SiC). Some embodiments include first source and drain regions that include impurity regions in the second fin portion and on both sides of the first gate electrode and a first epitaxial layer including the lattice modifying material. In some embodiments, a concentration of carbon in the first upper pattern does not exceed a concentration of carbon in the first epitaxial layer. In some embodiments, the concentration of carbon in the first upper pattern is in a range of about 0.5% to about 1.5% and the concentration of carbon in the first epitaxial layer is in a range of about 0.5% to about 3.0%.

Some embodiments provide that the semiconductor device comprises a p-channel metal oxide semiconductor (PMOS), the lattice modifying material comprises germanium, and the first upper pattern comprises silicon germanium (SiGe). Some embodiments include first source and drain regions that include impurity regions in the second fin portion and on both sides of the first gate electrode and a first epitaxial layer including the lattice modifying material. Some embodiments provide that a concentration of germanium in the first upper pattern does not exceed a concentration of germanium in the first epitaxial layer. In some embodiments, the concentration of germanium in the first upper pattern is in a range of about 50% to about 70%, and the concentration of germanium in the first epitaxial layer is in a range of about 50% to about 90%.

In some embodiments, a top surface of the second fin portion is recessed more than a top surface of the first fin portion, relative to the substrate.

Some embodiments provide that the fin-type active pattern comprises a first fin-type active pattern and the lattice modifying material comprises a first lattice modifying material. Some embodiments further include a second fin-type active pattern extending from the top surface of the substrate and through the trench defined in the field insulating layer. The second fin-type active pattern includes a second lower pattern that contacts the substrate and a second upper pattern that contacts the second lower pattern and protrudes further from the substrate than the field insulating layer. The second upper pattern comprises a second lattice modifying material that is different from the second lower pattern. The fin-type active pattern includes a third fin portion and a fourth fin portion that is on both sides of the third fin portion in the first direction. Some embodiments include a second gate electrode intersecting the second fin-type active pattern and extending in the second direction.

Some embodiments include first source and drain regions that include impurity regions in the second fin portion and on both sides of the first gate electrode and a first epitaxial layer including the lattice modifying material and second source and drain regions that include impurity regions in the fourth fin portion and on both sides of the second gate electrode and a second epitaxial layer including the second lattice modifying material. In some embodiments, the first lattice modifying material and the second lattice modifying material are a same material. Some embodiments provide that the first lattice modifying material comprises carbon and the second lattice modifying material comprises germanium.

Some embodiments include a dummy gate electrode on the field insulating layer and that is between the first gate electrode and the second gate electrode and that extends in the second direction.

Some embodiments include an oxide pattern formed on the substrate between the first and second fin-type active patterns. Some embodiments include a dummy gate electrode on the oxide pattern. In some embodiments, the dummy gate electrode is between the first gate electrode and the second gate electrode and extends in the second direction.

Some embodiments include first and second dummy gate electrodes at least partially on the oxide pattern. Some embodiments provide that the first and second dummy gate electrodes are spaced apart in the first direction between the first gate electrode and the second gate electrode and extend in the second direction.

Aspects of the present inventive concept also provide methods of fabricating a semiconductor device in which the operating performance of a transistor is improved by using silicon carbide in a channel layer of a transistor. Some embodiments of methods include forming a fin-type active pattern that extends in a first direction on a substrate, the fin-type active pattern including a lower pattern on the substrate and an upper pattern on the lower pattern, the upper pattern including a compound semiconductor material, the compound material having a different material than the substrate. A field insulating layer is formed on the substrate, on sidewalls of the fin-type active pattern and on a portion of the upper pattern that protrudes further away from the substrate than a top surface of the field insulating layer. A dummy gate pattern that intersects the fin-type active pattern and that extends in a second direction that is different from the first direction is formed. Dummy gate spacers are formed on side walls of the dummy gate pattern. Methods include forming recesses in the fin-type active pattern on both sides of the dummy gate pattern and forming source and drain regions on both sides of the dummy gate pattern.

Some embodiments include forming a first epitaxial layer on the source and drain regions, the first epitaxial layer substantially filling the recesses in the fin-type active pattern in both sides of the dummy gate pattern and including the different material.

In some embodiments, the compound semiconductor material includes a lattice modifying material.

Some embodiments include replacing the dummy gate pattern with a first gate pattern.

Some embodiments provide that forming the fin-type active pattern comprises forming a compound semiconductor layer including the compound semiconductor material on the substrate and patterning the compound semiconductor layer.

In some embodiments, forming the dummy gate pattern comprises forming a dummy gate insulating layer and forming a dummy gate electrode on the dummy gate insulating layer.

Some embodiments provide that forming the fin-type active pattern that extends in the first direction on the substrate comprises forming a first fin-type active pattern, that the lower pattern comprises a first lower pattern and the upper pattern comprises a first upper pattern, and the compound semiconductor material comprises a first compound semiconductor material. Methods may include forming a second fin-type active pattern that extends in the first direction on the substrate, the second fin-type active pattern including a second lower pattern on the substrate and a second upper pattern on the second lower pattern, the second upper pattern including a second compound semiconductor material, the second compound material having a different material than the substrate. In some embodiments, the first compound semiconductor material and the second compound semiconductor material are a same material. Some embodiments provide that the first compound semiconductor material is different from the second compound semiconductor material.

Some embodiments include forming a first gate electrode intersecting the fin-type active pattern and extending in a second direction that is different from the first direction and forming a second gate electrode that intersects the second fin-type active pattern and extending in the second direction. Some embodiments include forming a dummy gate electrode on the field insulating layer and that is between the first gate electrode and the second gate electrode and that extends in the second direction.

Some embodiments include forming an oxide pattern on the substrate between the first and second fin-type active patterns. In some embodiments, the dummy gate electrode is between the first gate electrode and the second gate electrode and extends in the second direction. Some embodiments provide that forming the dummy gate electrode comprises forming first and second dummy gate electrodes at least partially on the oxide pattern and that the first and second dummy gate electrodes are spaced apart in the first direction between the first gate electrode and the second gate electrode and extend in the second direction.

In some embodiments, the semiconductor device comprises an n-channel metal oxide semiconductor (NMOS), the compound semiconductor material comprises carbon, and the upper pattern comprises silicon carbide (SiC).

Some embodiments provide that the semiconductor device comprises a p-channel metal oxide semiconductor (PMOS), the compound semiconductor material comprises germanium, and the upper pattern comprises silicon germanium (SiGe).

However, aspects of the present inventive concept are not restricted to the one set forth herein. The above and other aspects of the present inventive concept will become more apparent to one of ordinary skill in the art to which the present inventive concept pertains by referencing the detailed description of the present inventive concept given below.

BRIEF DESCRIPTION OF THE DRAWINGS

The above and other aspects and features of the present inventive concept will become more apparent by describing in detail exemplary embodiments thereof with reference to the attached drawings.

DETAILED DESCRIPTION

Figure 1:
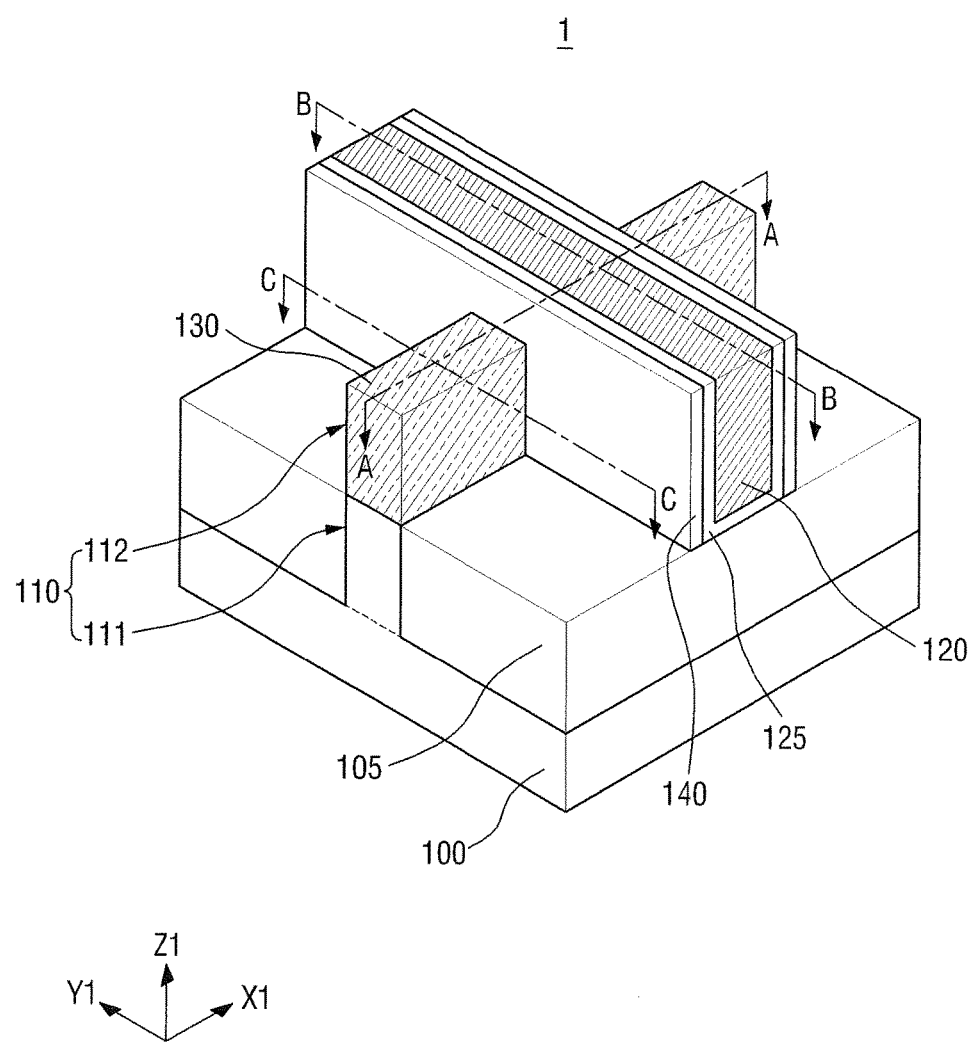
FIG. 1 is a perspective view of a semiconductor device according to a first embodiment of the present inventive concept.

The present inventive concept will now be described more fully hereinafter with reference to the accompanying drawings, in which preferred embodiments of the inventive concept are shown. This inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. The same reference numbers indicate the same components throughout the specification. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

A semiconductor device according to a first embodiment of the present inventive concept will now be described with reference to FIGS. 1 through 4.

Figure 2:
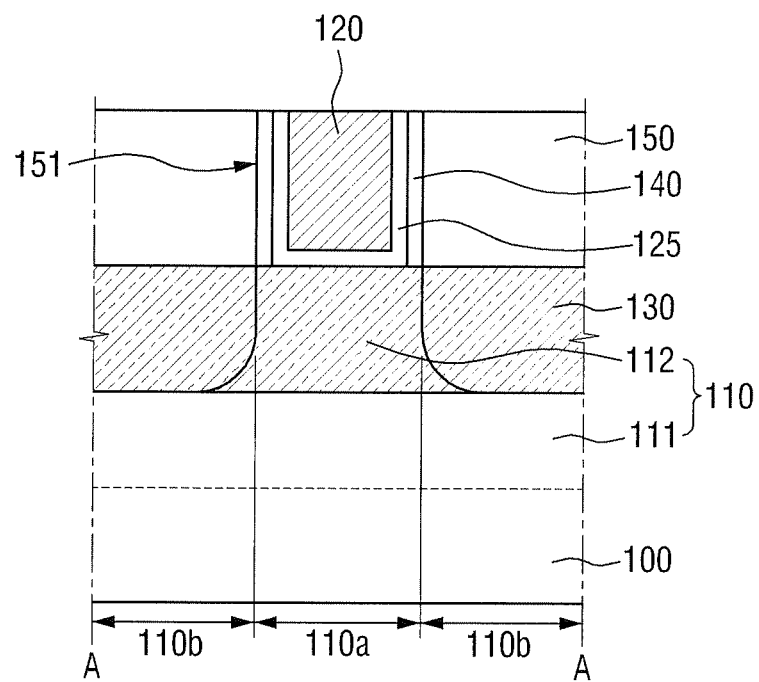
FIG. 2 is a cross-sectional view taken along the line A-A of FIG. 1.
Figure 3:
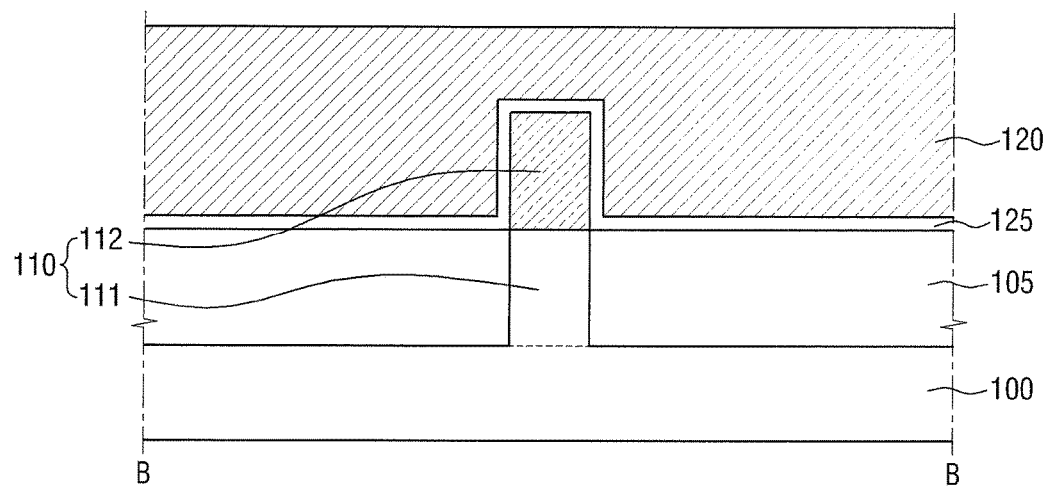
FIG. 3 is a cross-sectional view taken along the line B-B of FIG. 1.
Figure 4:
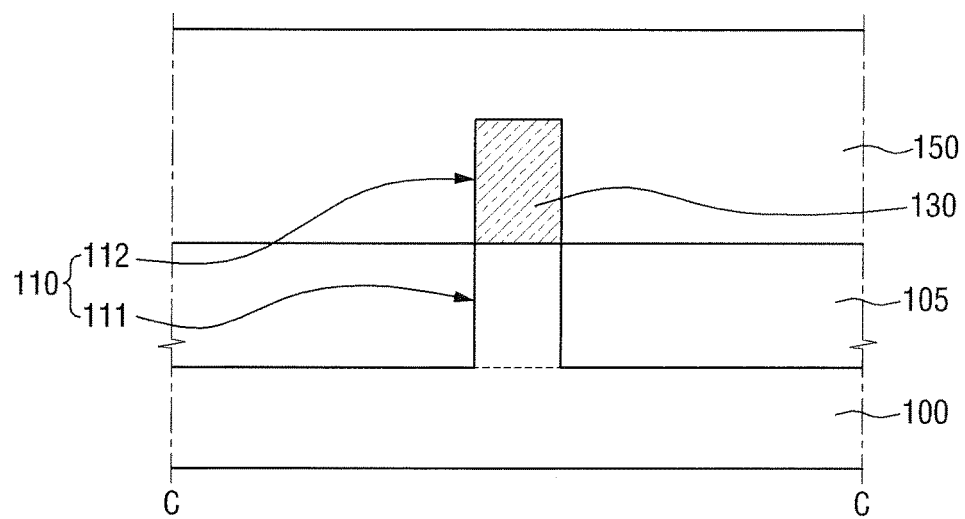
FIG. 4 is a cross-sectional view taken along the line C-C of FIG. 1.

FIG. 1 is a perspective view of a semiconductor device 1 according to a first embodiment of the present inventive concept. FIG. 2 is a cross-sectional view taken along the line A-A of FIG. 1. FIG. 3 is a cross-sectional view taken along the line B-B of FIG. 1. FIG. 4 is a cross-sectional view taken along the line C-C of FIG. 1. For ease of description, an interlayer insulating film 150 is not illustrated in FIG. 1.

Referring to FIGS. 1 through 4, the semiconductor device 1 according to the first embodiment may include a substrate 100, a first fin-type active pattern 110, a first gate electrode 120, and first source/drain regions 130.

The substrate 100 may be a bulk silicon substrate and/or a silicon-on-insulator (SOI) substrate. Otherwise, the substrate 100 may be a silicon substrate and/or may be a substrate made of another material such as silicon germanium, indium antimonide, lead telluride, indium arsenide, indium phosphide, gallium arsenide, and/or gallium antimonide. In some embodiments, the substrate 100 may consist of a base substrate and an epitaxial layer formed on the base substrate. Embodiments of the present inventive concept will be described based on the assumption that the substrate 100 is a silicon substrate.

A field insulating layer 105 may be formed on the substrate 100. The field insulating layer 105 may include one of an oxide layer, a nitride layer, an oxynitride layer, and/or combinations of the same.

The first fin-type active pattern 110 may protrude from the substrate 100. The field insulating layer 105 may partially cover sidewalls of the first fin-type active pattern 110. Therefore, a top surface of the first fin-type active pattern 110 may protrude further upward than a top surface of the field insulating layer 105. That is, the first fin-type active pattern 110 may be defined by the field insulating layer 105.

The first fin-type active pattern 110 includes a first lower pattern 111 and a first upper pattern 112 stacked sequentially on the substrate 100. The first lower pattern 111 protrudes from the substrate 100. The first upper pattern 112 is formed on the first lower pattern 111.

The first upper pattern 112 may be located at the top of the first fin-type active pattern 110. That is, the top surface of the first fin-type active pattern 110 may be a top surface of the first upper pattern 112.

Since the top surface of the first fin-type active pattern 110 protrudes further upward than the top surface of the field insulating layer 105, at least part of the first upper pattern 112 may protrude further upward than the field insulating layer 105.

For example, if the semiconductor device 1 is a transistor, the first upper pattern 112 may be used as a channel region of the transistor.

The first upper pattern 112 is directly connected to the first lower pattern 111. That is, the first upper pattern 112 directly contacts the first lower pattern 111. For example, the first lower pattern 111 may be a base on which the first upper pattern 112 is epitaxially grown, and the first upper pattern 112 may be an epitaxial layer formed on the first lower pattern 111.

The first lower pattern 111 is a silicon pattern containing silicon. The first upper pattern 112 is a compound semiconductor pattern containing a material which has a different lattice constant from the material of the first lower pattern 111.

The first lower pattern 111 is directly connected to the substrate 100. In addition, since the substrate 100 may be a silicon substrate and the first lower pattern 111 is a silicon pattern, they include the same material. In other words, since the substrate 100 and the first lower pattern 111 include silicon and are directly connected to each other, they may be an integral structure.

If the semiconductor device 1 according to the first embodiment of the present inventive concept is an n-channel metal oxide semiconductor (NMOS) transistor, the first upper pattern 112 may include a material (e.g., silicon carbide (SiC)) having a smaller lattice constant than silicon. That is, the first upper pattern 112 may be a silicon carbide pattern.

On the other hand, if the semiconductor device 1 according to the first embodiment of the present inventive concept is a p-channel metal oxide semiconductor (PMOS) transistor, the first upper pattern 112 may include a material (e.g., silicon germanium (SiGe)) having a greater lattice constant than silicon. That is, the first upper pattern 112 may be a silicon germanium pattern.

In FIGS. 1, 3 and 4, a contact surface of the first upper pattern 112 and the first lower pattern 111 lies in the same plane with the top surface of the field insulating layer 105. That is, the entire sidewalls of the first lower pattern 111 contact the field insulating layer 105, and the entire sidewalls of the first upper pattern 112 do not contact the field insulating layer 105. However, the present inventive concept is not limited thereto.

The first fin-type active pattern 110 may extend along a first direction X1. The first fin-type active pattern 110 includes a first portion 110a and a second portion 110b. The second portion 110b of the first fin-type active pattern 110 is disposed on both sides of the first portion 110a of the first fin-type active pattern 110 in the first direction X1.

In the semiconductor device 1 according to the first embodiment of the present inventive concept, a top surface of the first portion 110a of the first fin-type active pattern 110 and a top surface of the second portion 110b of the first fin-type active pattern 110 protrude further upward than the top surface of the field insulating layer 105. In addition, the top surface of the first portion 110a of the first fin-type active pattern 110 and the top surface of the second portion 110b of the first fin-type active pattern 110 lie in the same plane.

The interlayer insulating film 150 is formed on the field insulating layer 105. The interlayer insulating film 150 covers the first fin-type active pattern 110, the first source/drain regions 130, etc. The interlayer insulating film 150 includes a first trench 151 which intersects the first fin-type active pattern 110 and extends along a second direction Y1.

The interlayer insulating film 150 may include at least one of a low-k material, an oxide layer, a nitride layer, and/or an oxynitride layer. The low-k material may be made of, but not limited to, Flowable Oxide (FOX), Tonen SilaZen (TOSZ), Undoped Silica Glass (USG), Borosilica Glass (BSG), PhosphoSilaca Glass (PSG), BoroPhosphoSilica Glass (BPSG), Plasma Enhanced Tetra Ethyl Ortho Silicate (PETEOS), Fluoride Silicate Glass (FSG), High Density Plasma (HDP) oxide, Plasma Enhanced Oxide (PEOX), Flowable CVD (FCVD) oxide, and/or any combination of the same.

The first gate electrode 120 is formed on the first fin-type active pattern 110 and the field insulating layer 105. For example, the first gate electrode 120 is formed on the first portion 110a of the first fin-type active pattern 110.

More specifically, the first gate electrode 120 is formed on the sidewalls and top surface of the first upper pattern 112. The first upper pattern 112 protruding further upward than the top surface of the field insulating layer 105 is covered by the first gate electrode 120.

The first gate electrode 120 is formed in the first trench 151 included in the interlayer insulating film 150. The first gate electrode 120 extends along the second direction Y1 and intersects the first fin-type active pattern 110.

The first gate electrode 120 may include a metal layer. The first gate electrode 120 may include a portion that controls a work function and a portion that fills the first trench 151. The first gate electrode 120 may include at least one of W, Al, TiN, TaN, TiC, and/or TaC. In some embodiments, the first gate electrode 120 may be made of, e.g., Si and/or SiGe. In the semiconductor device 1 according to the first embodiment of the present inventive concept, the first gate electrode 120 may be formed by a replacement process.

A first gate insulating layer 125 may be formed between the first fin-type active pattern 110 and the first gate electrode 120. In addition, the first gate insulating layer 125 may be formed between the interlayer insulating film 150 and the first gate electrode 120.

The first gate insulating layer 125 may be formed along the top surface and sidewalls of the first portion 110a of the first fin-type active pattern 110. The first gate insulating layer 125 may be formed along the sidewalls and top surface of the first upper pattern 112 which protrudes further upward than the top surface of the field insulating layer 105.

The first gate insulating layer 125 may be disposed between the first gate electrode 120 and the field insulating layer 105. In other words, the first gate insulating layer 125 may be formed along sidewalls and a bottom surface of the first trench 151.

The first gate insulating layer 125 may include a silicon oxide layer and/or a high-k material having a higher dielectric constant than the silicon oxide layer. For example, the first gate insulating layer 125 may include one or more of, but not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and/or lead zinc niobate.

First gate spacers 140 may respectively be formed on sidewalls of the first gate electrode 120 extending along the second direction Y1. The first gate spacers 140 may include at least one of silicon nitride (SiN), silicon oxynitride (SiON), silicon oxide (SiO2), silicon oxycarbonitride (SiOCN), and/or combinations of the same. In the drawings, each of the first gate spacers 140 is illustrated as a single layer. However, the present inventive concept is not limited thereto, and each of the first gate spacers 140 can also have a multilayer structure.

The first source/drain regions 130 are respectively formed on both sides of the first gate electrode 120. In other words, each of the first source/drain regions 130 is formed in the second portion 110b of the first fin-type active pattern 110. Each of the first source/drain regions 130 may be formed within the first fin-type active pattern 110, that is, within the second portion 110b of the first fin-type active pattern 110.

In the drawings, each of the first source/drain regions 130 is formed in the first upper pattern 112 of the second portion 110b of the first fin-type active pattern 110. However, this is merely an example used for ease of description, and the present inventive concept is not limited to this example.

If the semiconductor device 1 according to the first embodiment of the present inventive concept is an NMOS transistor, the first source/drain regions 130 may include n-type impurities. The n-type impurities may be, but are not limited to, phosphorous (P), arsenic (As), and/or antimony (Sb), among others.

If the semiconductor device 1 according to the first embodiment of the present inventive concept is a PMOS transistor, the first source/drain regions 130 may include p-type impurities. The p-type impurities may be, but are not limited to, boron (B), among others.

Figure 5:
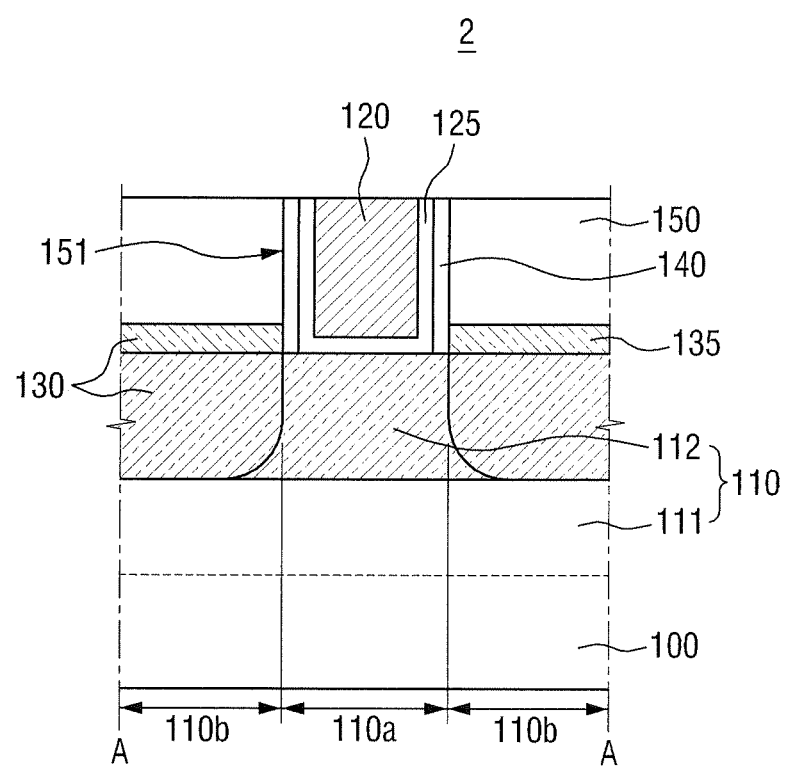
FIGS. 5 and 6 are views of a semiconductor device according to a second embodiment of the present inventive concept.
Figure 6:
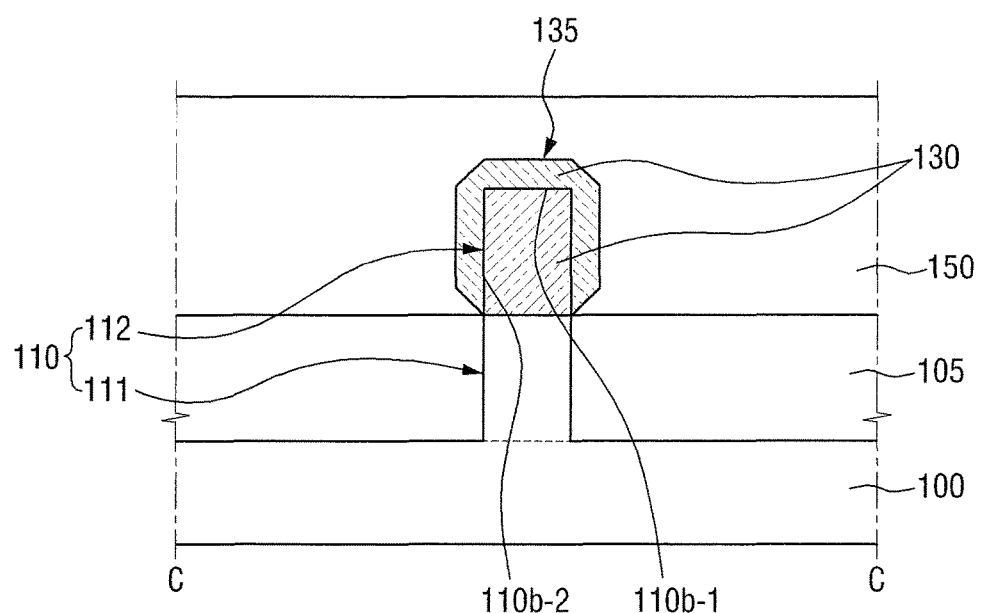

FIGS. 5 and 6 are views of a semiconductor device 2 according to a second embodiment of the present inventive concept. For simplicity, the current embodiment will hereinafter be described, focusing mainly on differences with the embodiment described above with reference to FIGS. 1 through 4.

Referring to FIGS. 5 and 6, the semiconductor device 2 according to the second embodiment further includes a first epitaxial layer 135.

Each of first source/drain regions 130 includes the first epitaxial layer 135. That is, each of the first source/drain regions 130 may include the first epitaxial layer 135 and an impurity region formed in a second portion 110b of a first fin-type active pattern 110.

The first epitaxial layer 135 is formed on the second portion 110b of the first fin-type active pattern 110. More specifically, in the semiconductor device 2 according to the second embodiment of the present inventive concept, the first epitaxial layer 135 is formed on all of a top surface 110b-1 and sidewalls 110b-2 of the second portion 110b of the first fin-type active pattern 110, which protrudes further upward than a top surface of a field insulating layer 105. The first epitaxial layer 135 is formed all around the second portion 110b of the first fin-type active pattern 110, which protrudes further upward than the top surface of the field insulating layer 105. The first epitaxial layer 135 may contact the field insulating layer 105.

The first epitaxial layer 135 is formed on sidewalls and a top surface of a first upper pattern 112 of the second portion 110b of the first fin-type active pattern 110. The first epitaxial layer 135 is formed around the first upper pattern 112.

Referring to FIG. 6, an outer circumferential surface of the first epitaxial layer 135 may have various shapes. For example, the outer circumferential surface of the first epitaxial layer 135 may be at least one of a diamond shape, a circular shape, and a rectangular shape. In FIG. 6, an octagonal shape is illustrated.

If the semiconductor device 2 according to the second embodiment of the present inventive concept is an NMOS transistor, the first epitaxial layer 135, like the first upper pattern 112, may include silicon carbide.

Both the first upper pattern 112 and the first epitaxial layer 135 may include silicon carbide. However, the proportion of carbon in the first epitaxial layer 135 may be equal to or greater than the proportion of carbon in the first upper pattern 112.

If the proportion of carbon in the first epitaxial layer 135 is greater than the proportion of carbon in the first upper pattern 112, a lattice constant of the first epitaxial layer 135 is smaller than that of the first upper pattern 112. Therefore, the first epitaxial layer 135 may enhance the mobility of carriers by applying tensile stress to a channel region of the first fin-type active pattern 110.

If the semiconductor device 2 according to the second embodiment of the present inventive concept is a PMOS transistor, the first epitaxial layer 135, like the first upper pattern 112, may include silicon germanium.

Both the first upper pattern 112 and the first epitaxial layer 135 may include silicon germanium. However, the proportion of germanium in the first epitaxial layer 135 may be equal to or greater than the proportion of germanium in the first upper pattern 112.

If the proportion of germanium in the first epitaxial layer 135 is greater than the proportion of germanium in the first upper pattern 112, the lattice constant of the first epitaxial layer 135 is greater than that of the first upper pattern 112. Therefore, the first epitaxial layer 135 may enhance the mobility of carriers by applying compressive stress to the channel region of the first fin-type active pattern 110.

Semiconductor devices according to third and fourth embodiments of the present inventive concept will now be described with reference to FIGS. 7 and 8. For simplicity, the current embodiment will hereinafter be described, focusing mainly on differences with the embodiment described above with reference to FIGS. 5 and 6.

Figure 7:
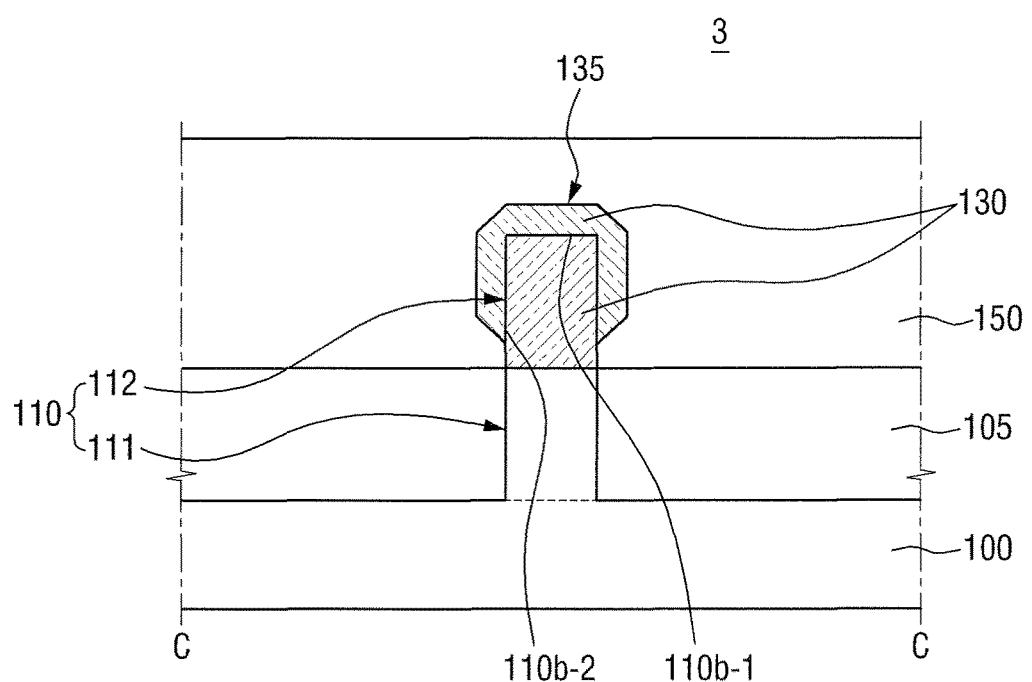
FIG. 7 is a view of a semiconductor device according to a third embodiment of the present inventive concept.

FIG. 7 is a view of a semiconductor device 3 according to a third embodiment of the present inventive concept. FIG. 8 is a view of a semiconductor device 4 according to a fourth embodiment of the present inventive concept.

Referring to FIG. 7, in the semiconductor device 3 according to the third embodiment of the present inventive concept, a first epitaxial layer 135 does not contact a field insulating layer 105.

The first epitaxial layer 135 is formed on part of sidewalls 110b-2 and a top surface 110b-1 of a second portion 110b of a first fin-type active pattern 110, which protrudes further upward than a top surface of the field insulating layer 105. That is, the first epitaxial layer 135 is formed around part of the second portion 110b of the first fin-type active pattern 110, which protrudes further upward than the top surface of the field insulating layer 105.

Figure 8:
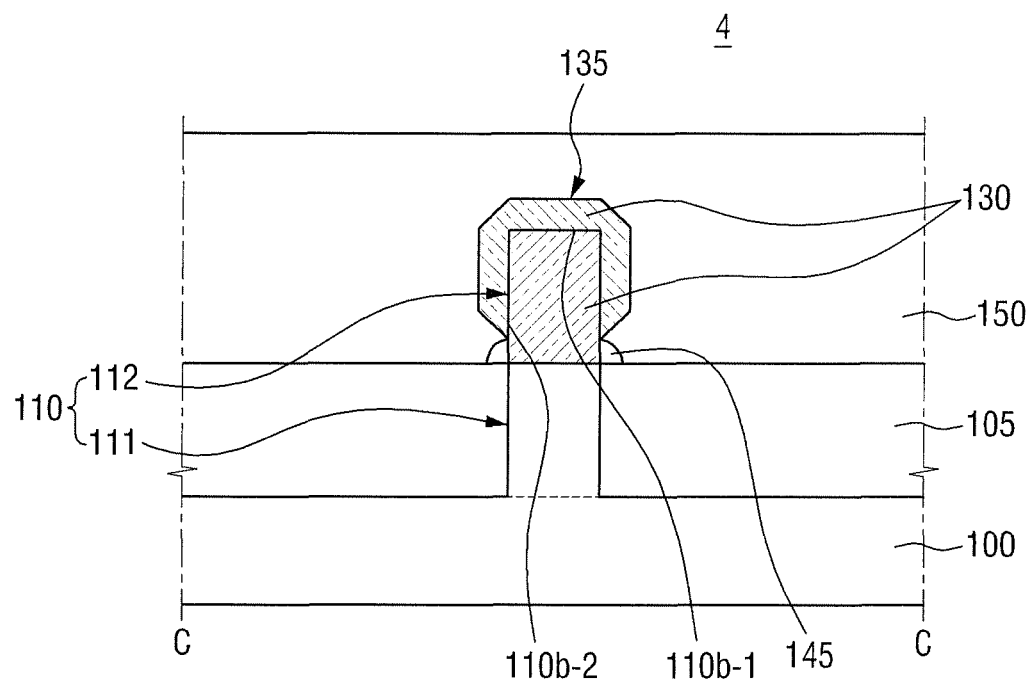
FIG. 8 is a view of a semiconductor device according to a fourth embodiment of the present inventive concept.

Referring to FIG. 8, the semiconductor device 4 according to the fourth embodiment of the present inventive concept further includes first fin spacers 145.

The first fin spacers 145 may be formed on part of sidewalls 110b-2 of a second portion 110b of a first fin-type active pattern 110, which protrudes further upward than a top surface of a field insulating layer 105. Therefore, part of the second portion 110b of the first fin-type active pattern 110 protrudes further upward than the first fin spacers 145. That is, part of the sidewalls 110b-2 of the second portion 110b of the first fin-type active pattern 110 is not covered by the first fin spacers 145.

Considering FIG. 1, since the first fin spacers 145 are formed on the sidewalls 110b-2 of the protruding second portion 110b of the first fin-type active pattern 110, they extend along a first direction X1.

In addition, the first fin spacers 145 are physically connected to first gate spacers 140 formed on sidewalls of a first gate electrode 120. The first fin spacers 145 and the first gate spacers 140 are connected to each other because they are formed at the same level. Here, the term "the same level" denotes that the first fin spacers 145 and the first gate spaces 140 are formed by the same fabrication process.

The first fin spacers 145 may include at least one of SiN, SiON, SiO2, SiOCN, and/or combinations of the same. In the drawings, each of the first fin spacers 145 is illustrated as a single layer. However, the present inventive concept is not limited thereto, and each of the first fin spacers 145 can also have a multilayer structure.

The first epitaxial layer 135 is formed on a top surface 110b-1 and the sidewalls 110b-2 of the second portion 110b of the first fin-type active pattern 110 which protrudes further upward than the first fin spacers 145. That is, the first epitaxial layer 135 is formed around the second portion 110b of the first fin-type active pattern 110 which protrudes further upward than the first fin spacers 145.

The first epitaxial layer 135 may contact the first fin spacers 145.

Figure 9:
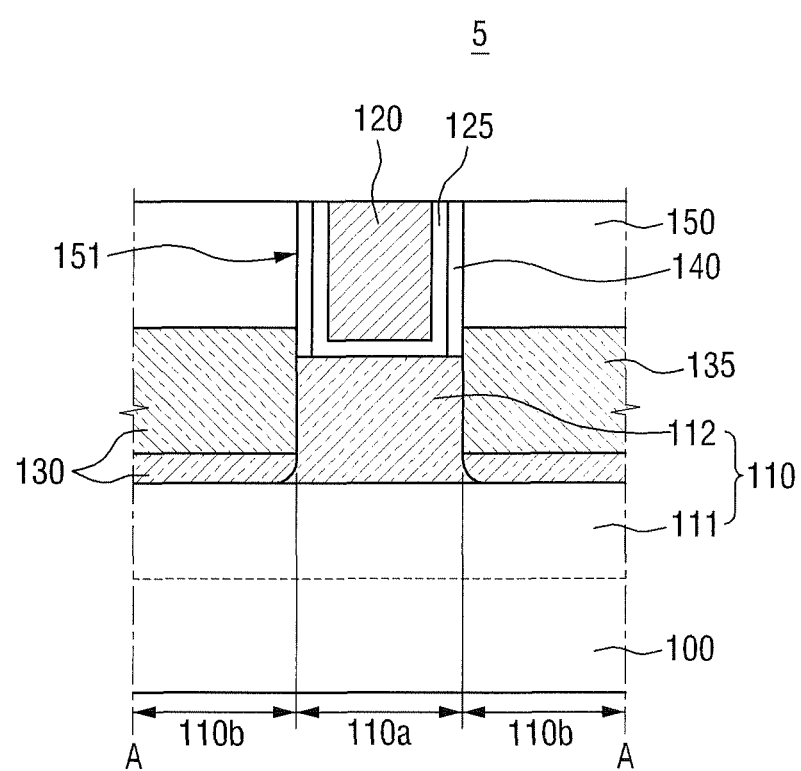
FIGS. 9 and 10 are views of a semiconductor device according to a fifth embodiment of the present inventive concept.
Figure 10:
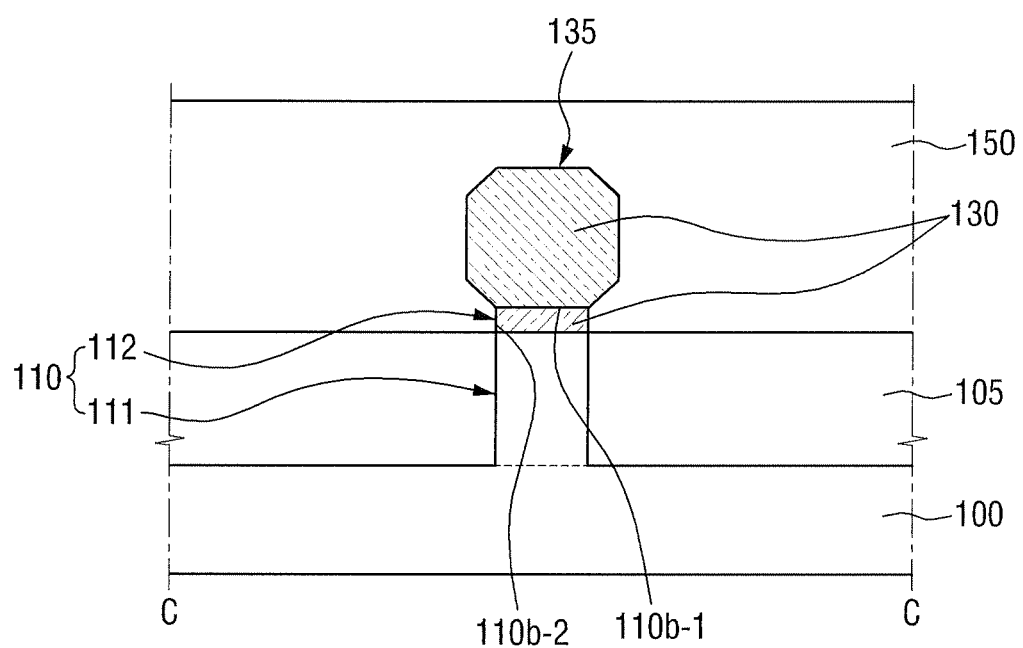

FIGS. 9 and 10 are views of a semiconductor device 5 according to a fifth embodiment of the present inventive concept. For simplicity, the current embodiment will hereinafter be described, focusing mainly on differences with the embodiment described above with reference to FIGS. 1 through 4.

Referring to FIGS. 9 and 10, in the semiconductor device 5 according to the fifth embodiment of the present inventive concept, a top surface of a second portion 110b of a first fin-type active pattern 110 is more recessed than a top surface of a first portion 110a of the first fin-type active pattern 110. In addition, the semiconductor device 5 further includes a first epitaxial layer 135.

More specifically, the top surface of the first portion 110a of the first fin-type active pattern 110 and the top surface of the second portion 110b of the first fin-type active pattern 110 protrude further upward than a top surface of a field insulating layer 105. However, the top surface of the first portion 110a of the first fin-type active pattern 110 and the top surface of the second portion 110b of the first fin-type active pattern 110 do not lie in the same plane.

In the semiconductor device 5 according to the fifth embodiment of the present inventive concept, a height from a top surface of a substrate 100 to the top surface of the first portion 110a of the first fin-type active pattern 110 is greater than a height from the top surface of the substrate 100 to the top surface of the second portion 110b of the first fin-type active pattern 110.

In addition, part of sidewalls 110b-2 of the second portion 110b of the first fin-type active pattern 110 contacts the field insulating layer 105, but the other part of the sidewalls 110b-2 of the second portion 110b of the first fin-type active pattern 110 does not contact the field insulating layer 105.

The first epitaxial layer 135 is formed on the recessed second portion 110b of the first fin-type active pattern 110. More specifically, in the semiconductor device 5 according to the fifth embodiment of the present inventive concept, the first epitaxial layer 135 is formed on a top surface 110b-1 of the second portion 110b of the first fin-type active pattern 110 which protrudes further upward than the top surface of the field insulating layer 105 but is not formed on the sidewalls 110b-2 of the second portion 110b of the first fin-type active pattern 110.

If the first epitaxial layer 135 includes, e.g., silicon carbide, the proportion of carbon in the first epitaxial layer 135 may be, but is not limited to, greater than the proportion of carbon in a first upper pattern 112.

If the first epitaxial layer 135 includes, e.g., silicon germanium, the proportion of germanium in the first epitaxial layer 135 may be, but is not limited to, greater than the proportion of germanium in the first upper pattern 112.

Each of first source/drain regions 130 may include the first epitaxial layer 135 and an impurity region formed in the recessed second portion 110b of the first fin-type active pattern 110.

Semiconductor devices according to sixth and seventh embodiments of the present inventive concept will now be described with reference to FIGS. 11 and 12. For simplicity, the current embodiment will hereinafter be described, focusing mainly on differences with the embodiment described above with reference to FIGS. 9 and 10.

Figure 11:
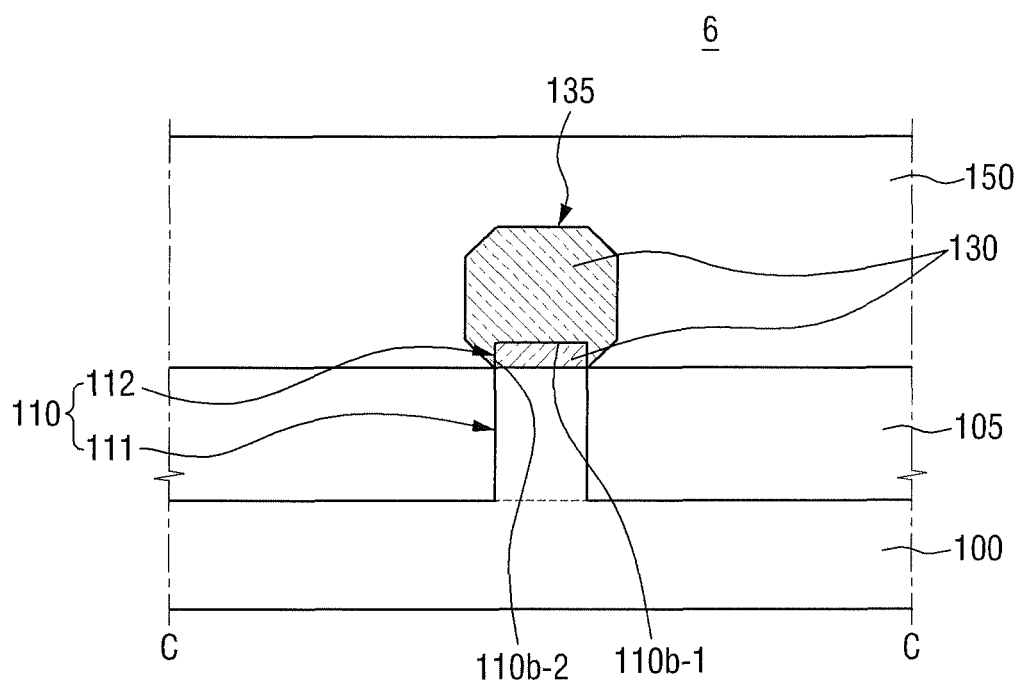
FIG. 11 is a view of a semiconductor device according to a sixth embodiment of the present inventive concept.

FIG. 11 is a view of a semiconductor device 6 according to a sixth embodiment of the present inventive concept. FIG.

12 is a view of a semiconductor device 7 according to a seventh embodiment of the present inventive concept.

Referring to FIG. 11, in the semiconductor device 6 according to the sixth embodiment of the present inventive concept, a first epitaxial layer 135 may contact a field insulating layer 105.

The first epitaxial layer 135 is formed on sidewalls 110b-2 and a top surface 110b-1 of a second portion 110b of a first fin-type active pattern 110, which protrudes further upward than a top surface of the field insulating layer 105. The first epitaxial layer 135 is formed around the second portion 110b of the first fin-type active pattern 110, which protrudes further upward than the top surface of the field insulating layer 105.

Figure 12:
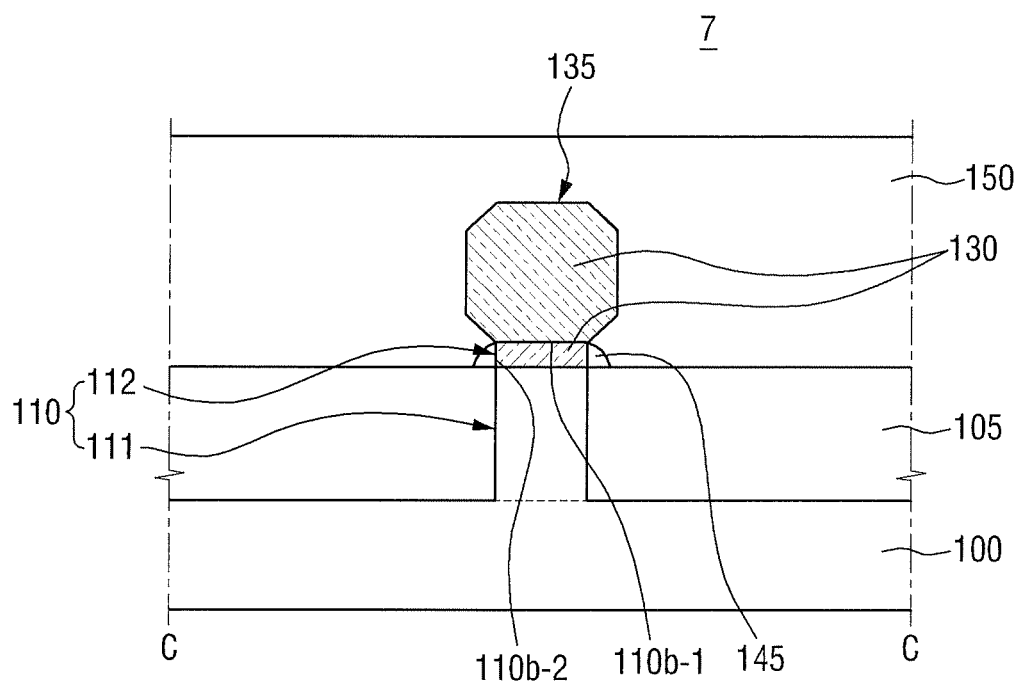
FIG. 12 is a view of a semiconductor device according to a seventh embodiment of the present inventive concept.

Referring to FIG. 12, the semiconductor device 7 according to the seventh embodiment of the present inventive concept further includes first fin spacers 145.

The first fin spacers 145 may be formed on sidewalls 110b-2 of a second portion 110b of a first fin-type active pattern 110 which protrudes further upward than a top surface of a field insulating layer 105. Therefore, the first fin spacers 145 may contact a first epitaxial layer 135.

In the drawing, the second portion 110b of the first fin-type active pattern 110 does not protrude further upward than the first fin spacers 145, but the present inventive concept is not limited thereto.

Figure 13:
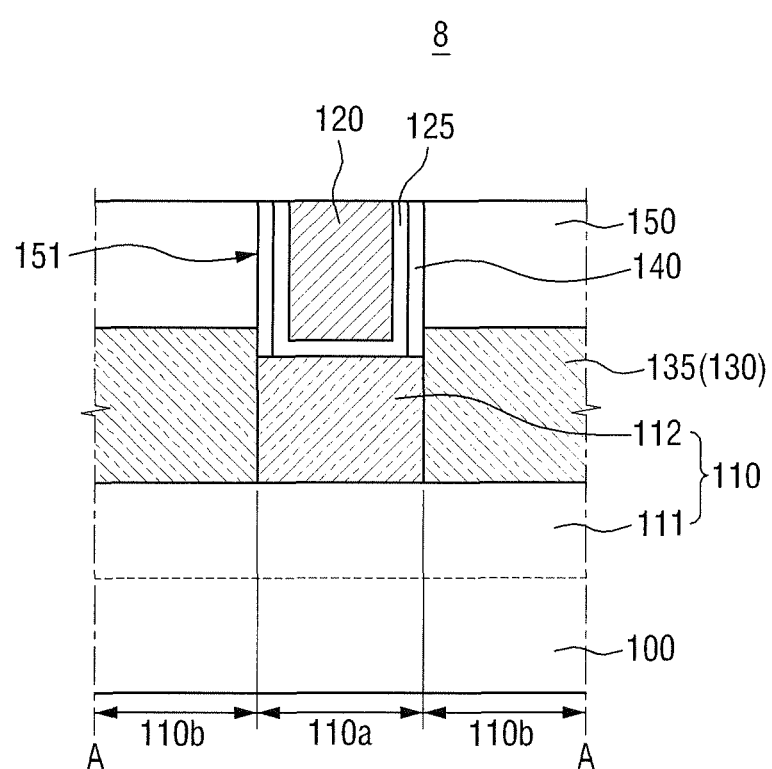
FIGS. 13 and 14 are views of a semiconductor device according to an eighth embodiment of the present inventive concept.
Figure 14:
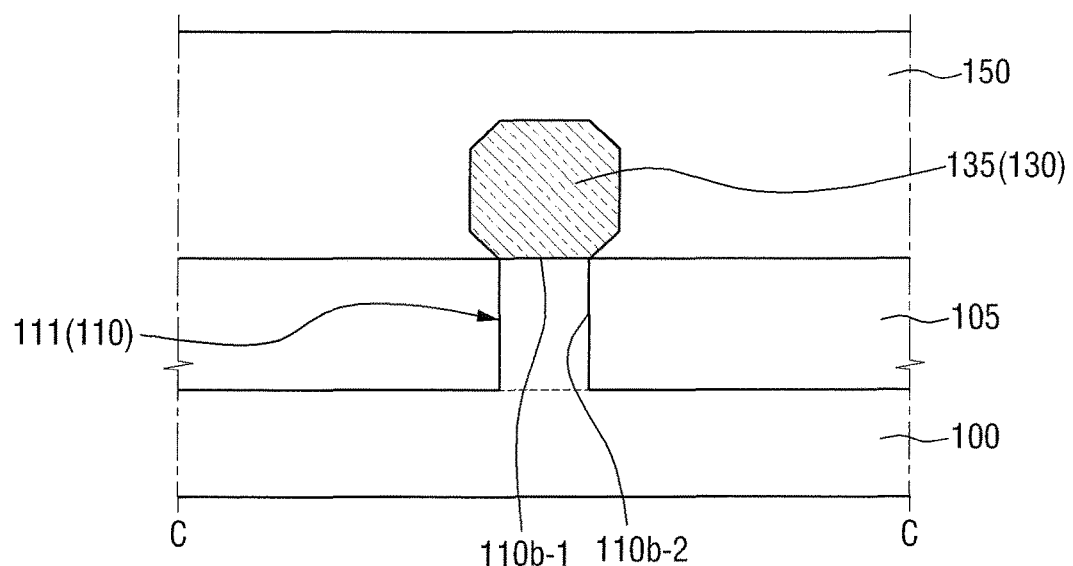

FIGS. 13 and 14 are views of a semiconductor device 8 according to an eighth embodiment of the present inventive concept. For simplicity, the current embodiment will hereinafter be described, focusing mainly on differences with the embodiment described above with reference to FIGS. 9 and 10.

Referring to FIGS. 13 and 14, in the semiconductor device 8 according to the eighth embodiment of the present inventive concept, the entire sidewalls 110b-2 of a second portion 110b of a first fin-type active pattern 110 may contact a field insulating layer 105.

A top surface 110b-1 of the second portion 110b of the first fin-type active pattern 110 may not protrude further upward than a top surface of the field insulating layer 105. That is, if the top surface of the field insulating layer 105 is flat as illustrated in the drawings, the top surface 110b-1 of the second portion 110b of the first fin-type active pattern 110 may lie in the same plane with the top surface of the field insulating layer 105.

Since the entire sidewalls 110b-2 of the second portion 110b of the first fin-type active pattern 110 are covered by the field insulating layer 105, a first epitaxial layer 135 is formed on the top surface 110b-1 of the second portion 110b of the first fin-type active pattern 110 but not on the sidewalls 110b-2 of the second portion 110b of the first fin-type active pattern 110.

Figure 15:
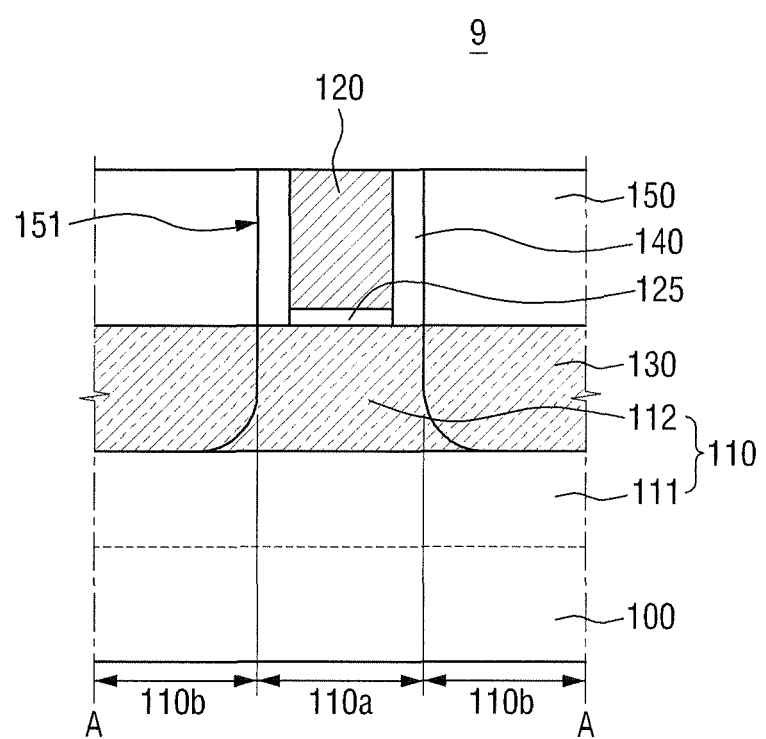
FIG. 15 is a view of a semiconductor device according to a ninth embodiment of the present inventive concept.

FIG. 15 is a view of a semiconductor device 9 according to a ninth embodiment of the present inventive concept. For simplicity, the current embodiment will hereinafter be described, focusing mainly on differences with the embodiment described above with reference to FIGS. 1 through 4.

Referring to FIG. 15, in the semiconductor device 9 according to the ninth embodiment of the present inventive concept, a first gate insulating layer 125 is formed along a bottom surface of a first trench 151 but not along sidewalls of the first trench 151.

The first gate insulating layer 125 is not formed along sidewalls of first gate spacers 140. The first gate insulating layer 125 does not include a portion which lies in the same plane with a top surface of a first gate electrode 120.

Therefore, the first gate insulating layer 125 is interposed between the first gate electrode 120 and the first fin-type active pattern 110 but not between the first gate electrode 120 and the first gate spacers 140.

The first gate insulating layer 125 is not formed by a replacement process. The first gate electrode 120 may also not be formed by a replacement process, but the present inventive concept is not limited thereto.

A semiconductor device according to a tenth embodiment of the present inventive concept will now be described with reference to FIGS. 16A through 18.

Figure 16A:
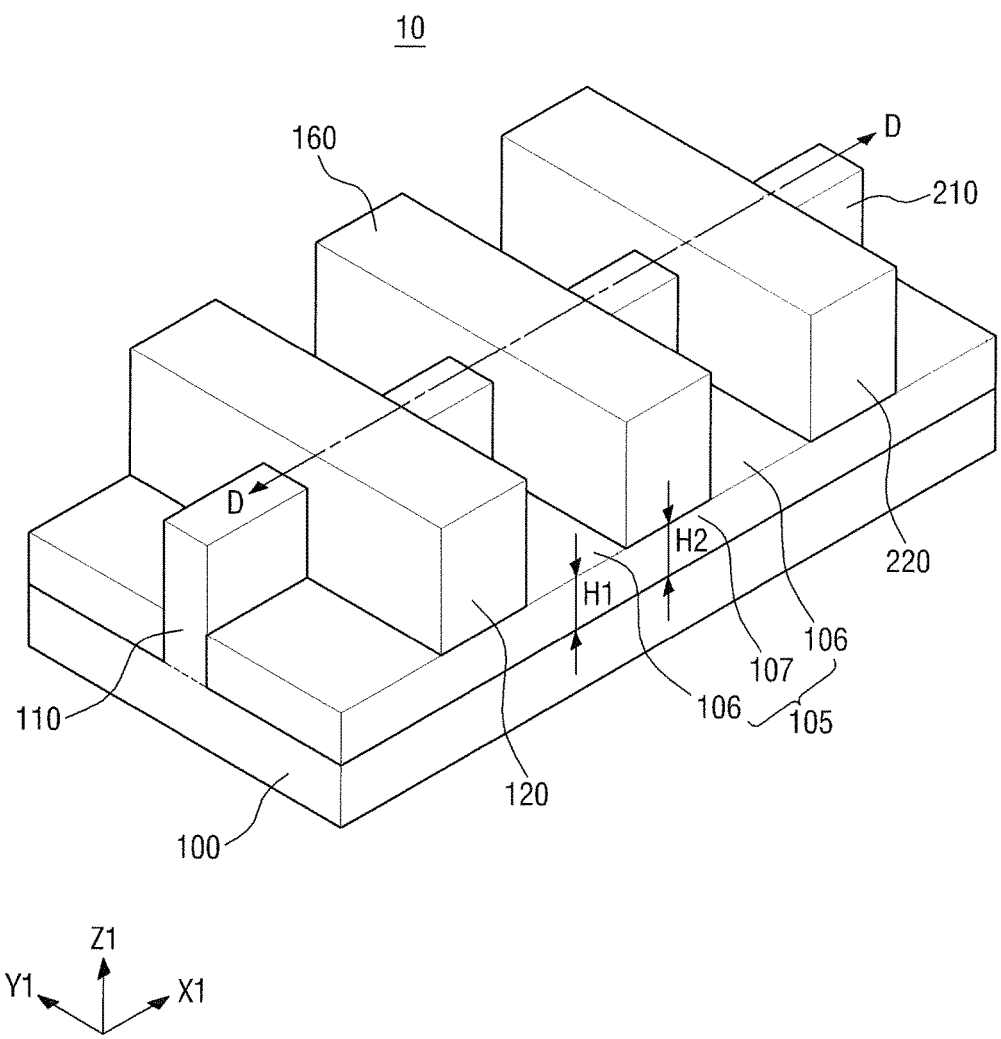
FIGS. 16A and 16B respectively are perspective and plan views of a semiconductor device according to a tenth embodiment of the present inventive concept.
Figure 16B:
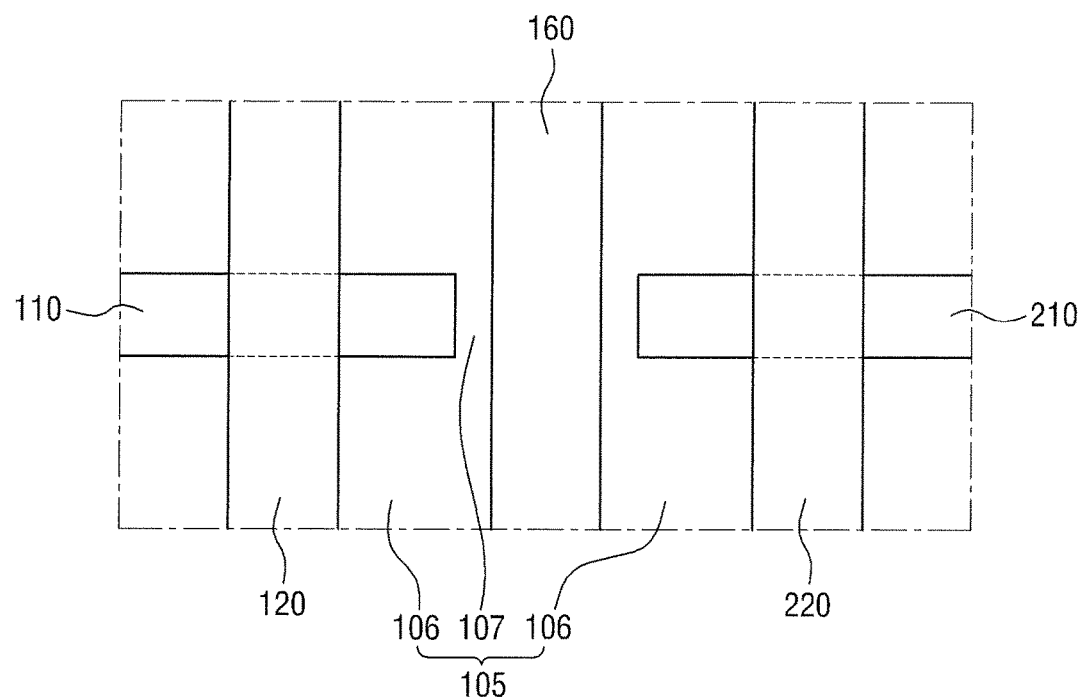
Figure 17:
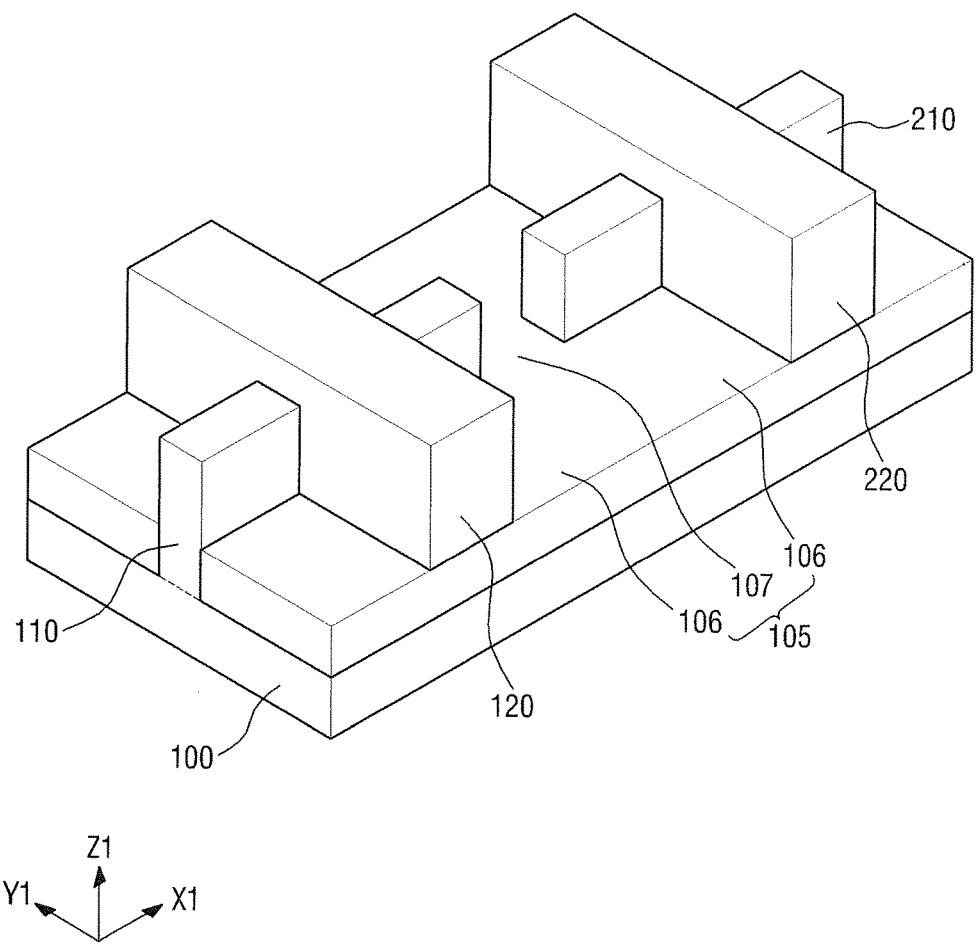
FIG. 17 is a partial perspective view of first and second fin-type active patterns and a field insulating layer illustrated in FIG. 16A.
Figure 18:
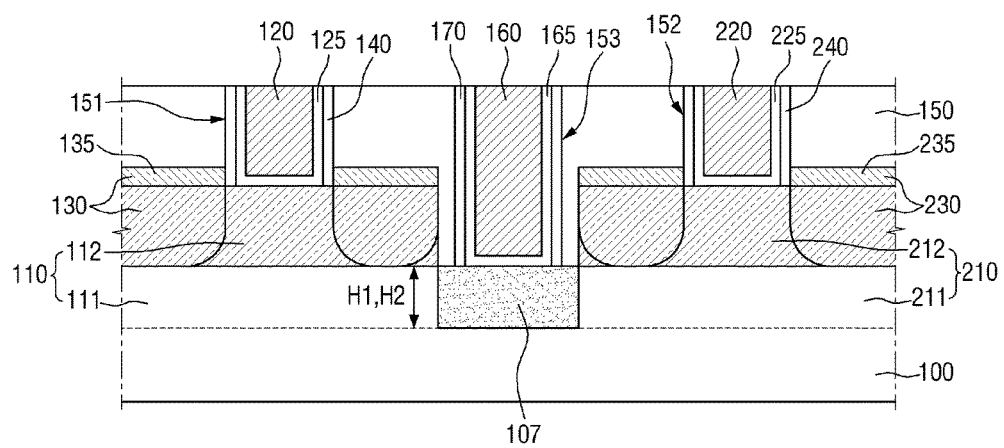
FIG. 18 is a cross-sectional view taken along the line D-D of FIG. 16A.

FIGS. 16A and 16B respectively are perspective and plan views of a semiconductor device 10 according to a tenth embodiment of the present inventive concept. FIG. 17 is a partial perspective view of first and second fin-type active patterns 110 and 210 and a field insulating layer 105 illustrated in FIG. 16A. FIG. 18 is a cross-sectional view taken along the line D-D of FIG. 16A.

The cross-sectional view of FIG. 18 is related to the semiconductor devices 2 through 4 according to the second through fourth embodiments of the present inventive concept. However, the present inventive concept is not limited thereto. That is, the cross-sectional view of FIG. 18 may also be a cross-sectional view of any one of the semiconductor devices 1 through 9 according to the first through ninth embodiments of the present inventive concept.

Referring to FIGS. 16A through 18, the semiconductor device 10 according to the tenth embodiment of the present inventive concept may include the field insulating layer 105, the first fin-type active pattern 110, the second fin-type active pattern 210, a first gate electrode 120, a second gate electrode 220, and a first dummy gate electrode 160.

The first fin-type active pattern 110 and the second fin-type active pattern 210 are formed on a substrate 100. The first fin-type active pattern 110 and the second fin-type active pattern 210 protrude from the substrate 100.

The first fin-type active pattern 110 and the second fin-type active pattern 210 extend along a first direction X1. The first fin-type active pattern 110 and the second fin-type active pattern 210 are formed side by side along a lengthwise direction. The first fin-type active pattern 110 and the second fin-type active pattern 210 are formed adjacent to each other.

Since each of the first fin-type active pattern 110 and the second fin-type active pattern 210 extends along the first direction X1, it may include long sides extending along the first direction X1 and short sides extending along a second direction Y1.

That is, if the first fin-type active pattern 110 and the second fin-type active pattern 210 extend side by side along the lengthwise direction, it means that the short sides of the first fin-type active pattern 110 face the short sides of the second fin-type active pattern 210.

The first fin-type active pattern 110 includes a first lower pattern 111 and a first upper pattern 112 stacked sequentially on the substrate 100. The second fin-type active pattern 210 includes a second lower pattern 211 and a second upper pattern 212 stacked sequentially on the substrate 100.

In addition, a top surface of the first fin-type active pattern 110 may be a top surface of the first upper pattern 112, and a top surface of the second fin-type active pattern 210 may be a top surface of the second upper pattern 212.

Like the first fin-type active pattern 110, the second upper pattern 212 is directly connected to the second lower pattern 211. In addition, the second lower pattern 211 is directly connected to the substrate 100.

Like the first lower pattern 111, the second lower pattern 211 is a silicon pattern containing silicon. The second upper pattern 212 may be a silicon carbide pattern containing silicon carbide or a silicon germanium pattern containing silicon germanium.

The first upper pattern 112 and the second upper pattern 212 may include the same material. That is, the first upper pattern 112 and the second upper pattern 212 may be, but are not limited to, silicon carbide patterns or silicon germanium patterns.

The field insulating layer 105 is formed on the substrate 100. The field insulating layer 105 is formed around the first fin-type active pattern 110 and the second fin-type active pattern 210. Accordingly, the first fin-type active pattern 110 and the second fin-type active pattern 210 may be defined by the field insulating layer 105.

The field insulating layer 105 includes a first region 106 and a second region 107. The first region 106 of the field insulating layer 105 contacts the long sides of the first fin-type active pattern 110 and the long sides of the second fin-type active pattern 210. The first region 106 of the field insulating layer 105 may extend in the first direction X1 along the long sides of the first fin-type active pattern 110 and the long sides of the second fin-type active pattern 210.

The second region 107 of the field insulating layer 105 contacts a short side of the first fin-type active pattern 110 and a short side of the second fin-type active pattern 210. The second region 107 of the field insulating layer 105 is formed between the short side of the first fin-type active pattern 110 and the short side of the second fin-type active pattern 210 to extend along the second direction Y1.

In the semiconductor device 10 according to the tenth embodiment of the present inventive concept, a top surface of the first region 106 of the field insulating layer 105 and a top surface of the second region 107 of the field insulating layer 105 may lie in the same plane. That is, a height H1 of the first region 106 of the field insulating layer 105 may be equal to a height H2 of the second region 107 of the field insulating layer 105.

The first gate electrode 120 is formed on the first fin-type active pattern 110 and the first region 106 of the field insulating layer 105. The first gate electrode 120 intersects the first fin-type active pattern 110.

The second gate electrode 220 is formed on the second fin-type active pattern 210 and the first region 106 of the field insulating layer 105. The second gate electrode 220 intersects the second fin-type active pattern 210.

The first gate electrode 120 and the second gate electrode 220 may extend along the second direction Y1. In the drawings, one first gate electrode 120 intersecting the first fin-type active pattern 110 and one second gate electrode 220 intersecting the second fin-type active pattern 210 are illustrated. However, this is merely an example used for ease of description, and the present inventive concept is not limited to this example.

At least part of the first dummy gate electrode 160 is formed on the second region 107 of the field insulating layer 105. The first dummy gate electrode 160 is formed side by side with the first gate electrode 120 and the second gate electrode 220. The first dummy gate electrode 160 is formed between the first gate electrode 120 and the second gate electrode 220. The first gate electrode 160 may extend along the second direction Y1.

In the semiconductor device 10 according to the tenth embodiment of the present inventive concept, the entire first dummy gate electrode 160 is formed on the second region 107 of the field insulating layer 105. That is, the entire first dummy gate electrode 160 overlaps the second region 107 of the field insulating layer 105.

The first dummy gate electrode 160 is formed between a short side of the first fin-type active pattern 110 and a short side of the second fin-type active pattern 210. In other words, the first dummy gate electrode 160 is formed between an end of the first fin-type active pattern 110 and an end of the second fin-type active pattern 210. The first dummy gate electrode 160 may extend between the end of the first fin-type active pattern 110 and the end of the second fin-type active pattern 210 to be formed on the second region 107 of the field insulating layer 105.

In addition, one first dummy gate electrode 160 may be formed between the first fin-type active pattern 110 and the second fin-type active pattern 210. Since only one first dummy gate electrode 160, not two or more first dummy gate electrodes, is formed between the first fin-type active pattern 110 and the second fin-type active pattern 210, layout size can be reduced.

Like the first gate electrode 120, the second gate electrode 220 may include at least one of W, Al, TiN, TaN, TiC, and/or TaC. The second gate electrode 220 may be formed in a second trench 152 included in an interlayer insulating film 150.

The first dummy gate electrode 160 may have the similar structure as the first gate electrode 120 and the second gate electrode 220. The first dummy gate electrode 160 may include at least one of W, Al, TiN, TaN, TiC and/or TaC.

The first dummy gate electrode 160 may be formed in a third trench 153 included in the interlayer insulating film 150. The third trench 153 may extend along the second direction Y1 to overlap the second region 107 of the field insulating layer 105.

Like the first gate electrode 120 and the second gate electrode 220, the first dummy gate electrode 160 may be formed by, but not limited to, a replacement process (or a gate last process).

A second gate insulating layer 225 may be formed along the top surface and sidewalls of the second fin-type active pattern 210. The second gate insulating layer 225 may be formed along sidewalls and a bottom surface of the second trench 152.

A first dummy gate insulating layer 165 may be formed along sidewalls and a bottom surface of the third trench 153. In other words, the first dummy gate insulating layer 165 may be formed along sidewalls of first dummy gate spacers 170 and the top surface of the second region 107 of the field insulating layer 105.

The second gate insulating layer 225 and the first dummy gate insulating layer 165 may include a silicon oxide layer and/or a high-k material having a higher dielectric constant than the silicon oxide layer.

In the drawings, the entire first dummy gate spacers 170 are formed on the second region 107 of the field insulating layer 105 and thus do not contact the first fin-type active pattern 110 and the second fin-type active pattern 210. However, the present inventive concept is not limited thereto.

Second source/drain regions 230 are respectively formed on both sides of the second gate electrode 220. Each of the second source/drain regions 230 may include a second epitaxial layer 235. The second epitaxial layer 235 may be identical to the first epitaxial layer 135 described above, and thus a redundant description thereof is omitted.

Semiconductor devices according to eleventh and twelfth embodiments of the present inventive concept will now be described with reference to FIGS. 19 through 21. For simplicity, the current embodiments will hereinafter be described, focusing mainly on differences with the embodiment described above with reference to FIGS. 16 through 18.

Figure 19:
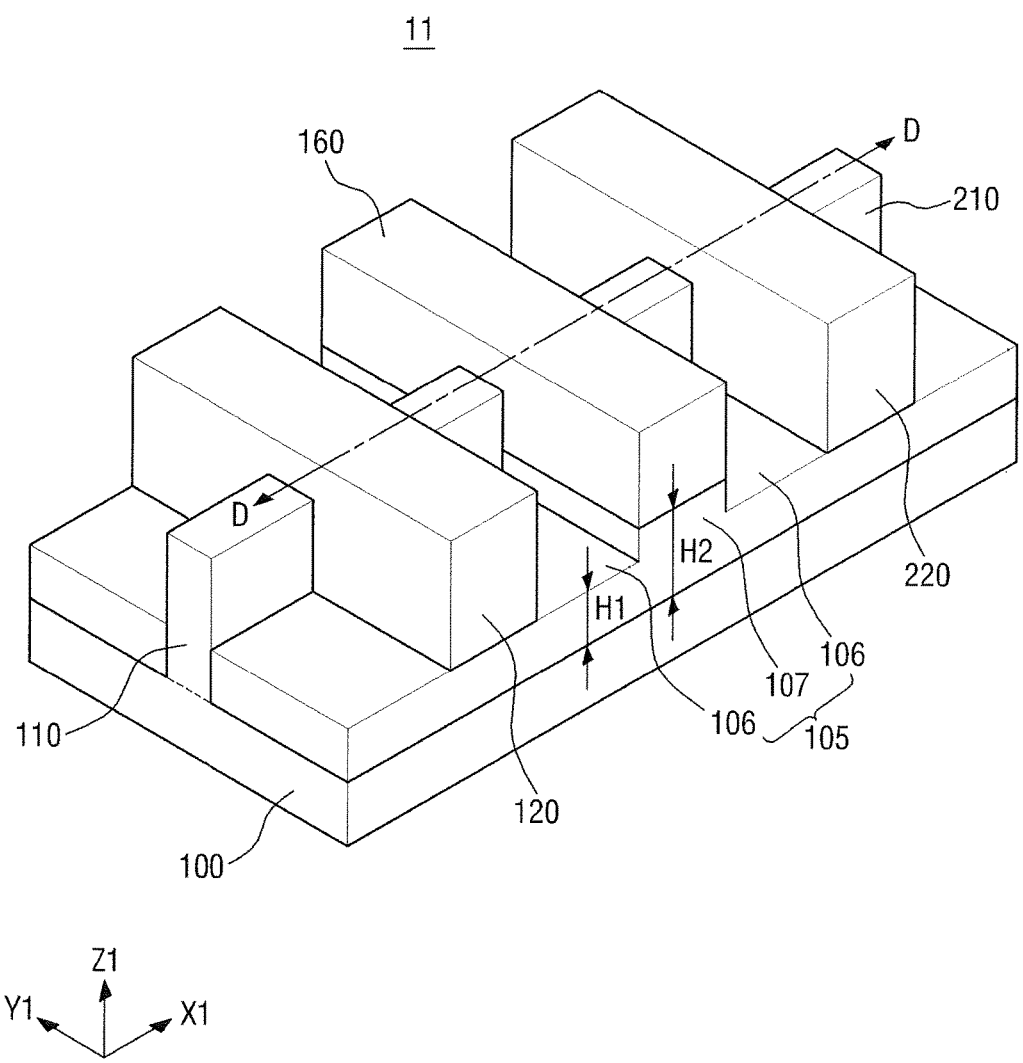
FIGS. 19 and 20 are views of a semiconductor device according to an eleventh embodiment of the present inventive concept.
Figure 20:
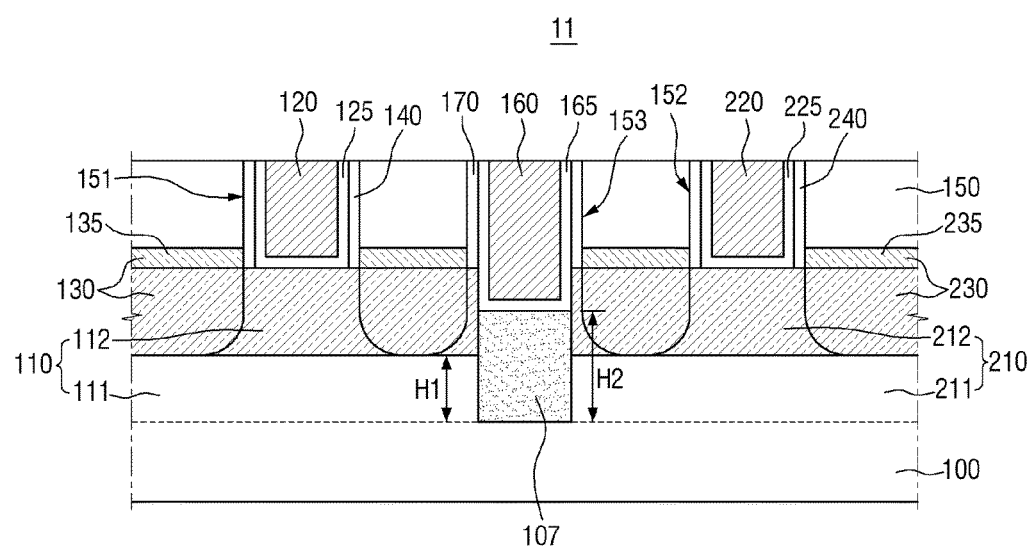

FIGS. 19 and 20 are views of a semiconductor device 11 according to an eleventh embodiment of the present inventive concept. FIG. 21 is a cross-sectional view of a semiconductor device 12 according to a twelfth embodiment of the present inventive concept.

Referring to FIGS. 19 and 20, in the semiconductor device 11 according to the eleventh embodiment of the present inventive concept, a top surface of a second region 107 of a field insulating layer 105 is higher than that of a first region 106 of the field insulating layer 105. However, the top surface of the second region 107 of the field insulating layer 105 is lower than that of a first fin-type active pattern 110 and that of a second fin-type active pattern 210.

That is, the top surface of the first region 106 of the field insulating layer 105 and the top surface of the second region 107 of the field insulating layer 105 do not lie in the same plane.

More specifically, a height H2 of the second region 107 of the field insulating layer 105 is greater than a height H1 of the first region 106 of the field insulating layer 105. However, the height H2 of the second region 107 of the field insulating layer 105 is smaller than a height of the first fin-type active pattern 110 and a height of the second fin-type active pattern 210. As illustrated, heights may refer to relative distances from a surface of the substrate 100.

In the drawing, part of the first fin-type active pattern 110 and part of the second fin-type active pattern 210 overlap the first dummy gate spacers 170. However, the present inventive concept is not limited thereto.

Figure 21:
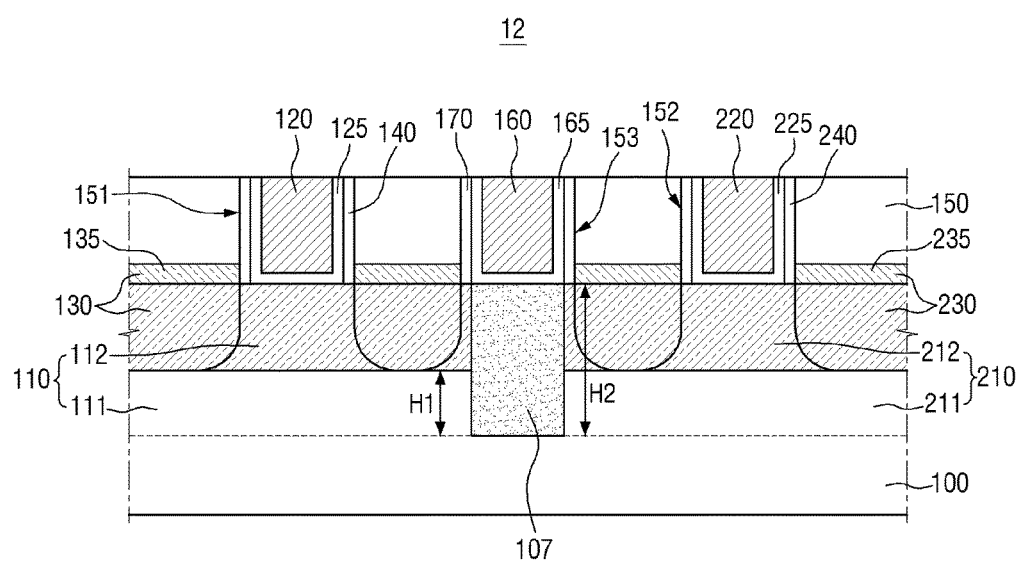
FIG. 21 is a cross-sectional view of a semiconductor device according to a twelfth embodiment of the present inventive concept.

Referring to FIG. 21, in the semiconductor device 12 according to the twelfth embodiment of the present inventive concept, a top surface of a second region 107 of a field insulating layer 105 is higher than a top surface of a first region 106 of the field insulating layer 105.

In addition, the top surface of the second region 107 of the field insulating layer 105 may be at the same level as or higher than a top surface of a first fin-type active pattern 110 and a top surface of a second fin-type active pattern 210.

In the drawing, the top surface of the second region 107 of the field insulating layer 105 lies in the same plane with the top surface of the first fin-type active pattern 110 and the top surface of the second fin-type active pattern 210. However, the present inventive concept is not limited thereto.

Figure 22:
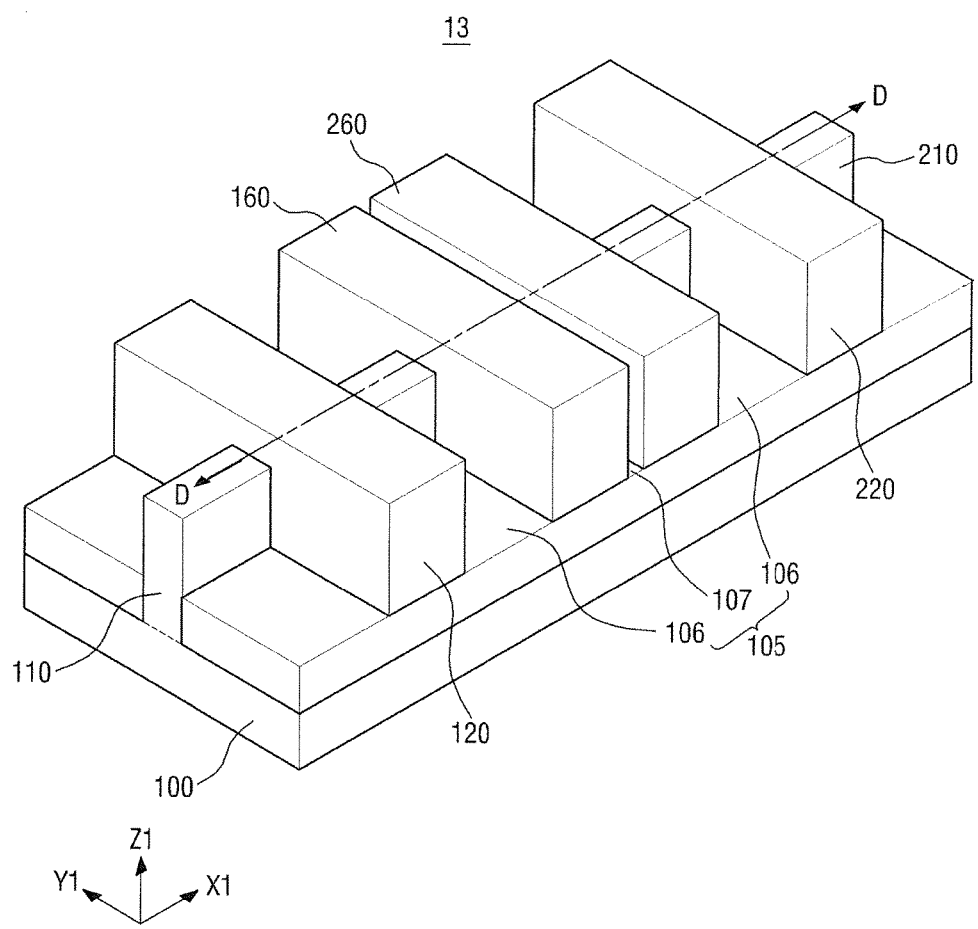
FIGS. 22 and 23 are views of a semiconductor device according to a thirteenth embodiment of the present inventive concept.
Figure 23:
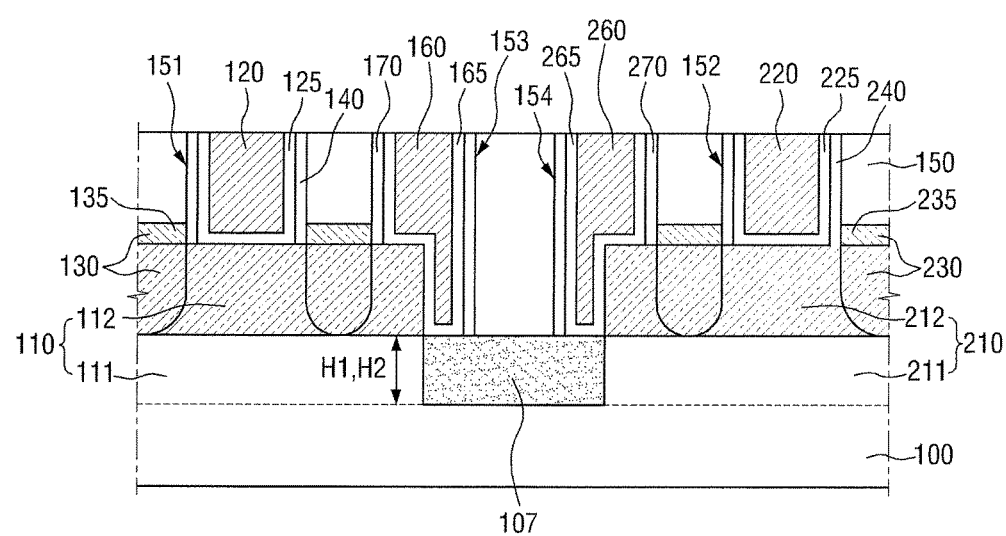

FIGS. 22 and 23 are views of a semiconductor device 13 according to a thirteenth embodiment of the present inventive concept. For simplicity, the current embodiment will hereinafter be described, focusing mainly on differences with the embodiment described above with reference to FIGS. 16 through 18.

Referring to FIGS. 22 and 23, the semiconductor device 13 according to the thirteenth embodiment of the present inventive concept further includes a second dummy gate electrode 260.

The second dummy gate electrode 260 is formed side by side with a first gate electrode 120 and a second gate electrode 220. The second dummy gate electrode 260 is formed between the first gate electrode 120 and the second gate electrode 220. The second dummy gate electrode 260 may extend along a second direction Y1.

The second dummy gate electrode 260 may have the similar structure as a first dummy gate electrode 160, and thus a description thereof is omitted.

In the semiconductor device 13 according to the thirteenth embodiment of the present inventive concept, part of the first dummy gate electrode 160 and part of the second dummy gate electrode 260 are formed on a second region 107 of a field insulating layer 105. That is, only part of the first dummy gate electrode 160 may overlap the second region 107 of the field insulating layer 105, and only part of the second dummy gate electrode 260 may overlap the second region 107 of the field insulating layer 105.

In other words, a part of the first dummy gate electrode 160 is formed on the second region 107 of the field insulating layer 105, and the other part of the first dummy gate electrode 160 is formed on the first region 106 of the field insulating layer 105 and a first fin-type active pattern 110. In addition, a part of the second dummy gate electrode 260 is formed on the second region 107 of the field insulating layer 105, and the other part of the second dummy gate electrode 260 is formed on the first region 106 of the field insulating layer 105 and the second fin-type active pattern 210.

In FIG. 23, a height H1 of the first region 106 of the field insulating layer 105 is equal to a height H2 of the second region 107 of the field insulating layer 105. However, the present inventive concept is not limited thereto.

That is, as illustrated in FIG. 19 and FIG. 20, a top surface of the second region 107 of the field insulating layer 105 is higher than a top surface of the first region 106 of the field insulating layer 105. However, the top surface of the second region 107 of the field insulating layer 105 is lower than a top surface of the first fin-type active pattern 110 and a top surface of the second fin-type active pattern 210.

In some embodiments, the top surface of the second region 107 of the field insulating layer 105 is higher than the top surface of the first region 106 of the field insulating layer 105. In addition, the top surface of the second region 107 of the field insulating layer 105 may be at the same level as or higher than the top surface of the first fin-type active pattern 110 and the top surface of the second fin-type active pattern 210.

Semiconductor devices according to fourteenth through twenty-second embodiments of the present inventive concept will now be described with reference to FIGS. 24 through 36.

Figure 24:
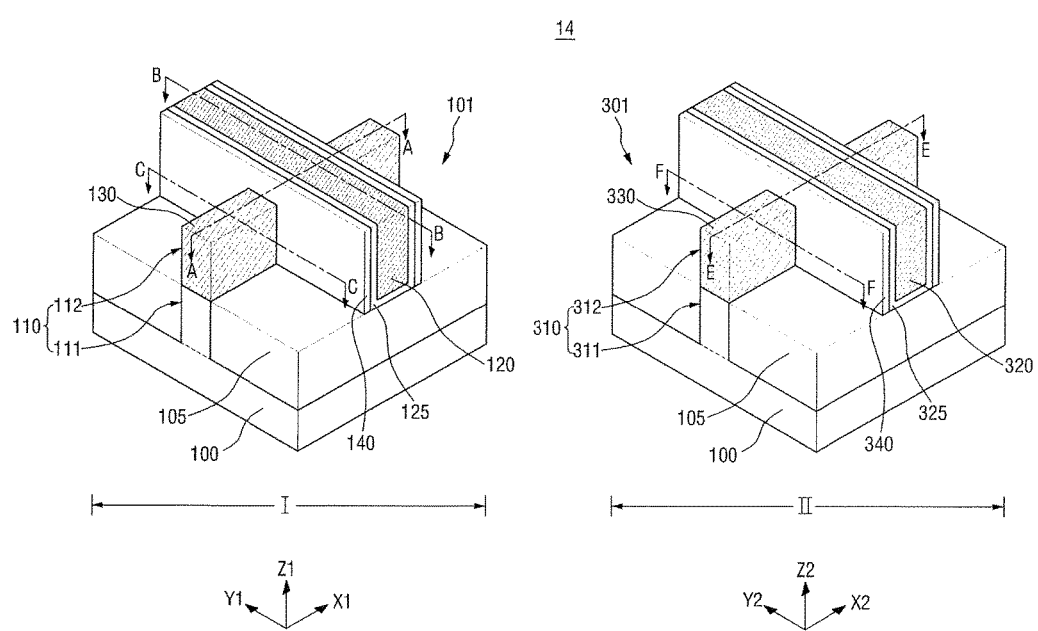
FIG. 24 is a perspective view of a semiconductor device according to a fourteenth embodiment of the present inventive concept.
Figure 25:
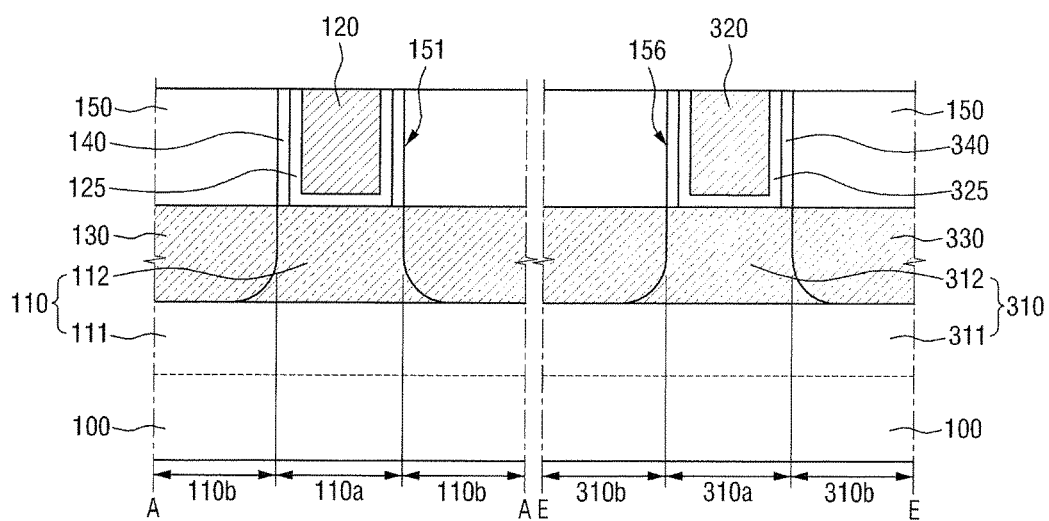
FIG. 25 is a cross-sectional view taken along the lines A-A and E-E of FIG. 24.
Figure 26:
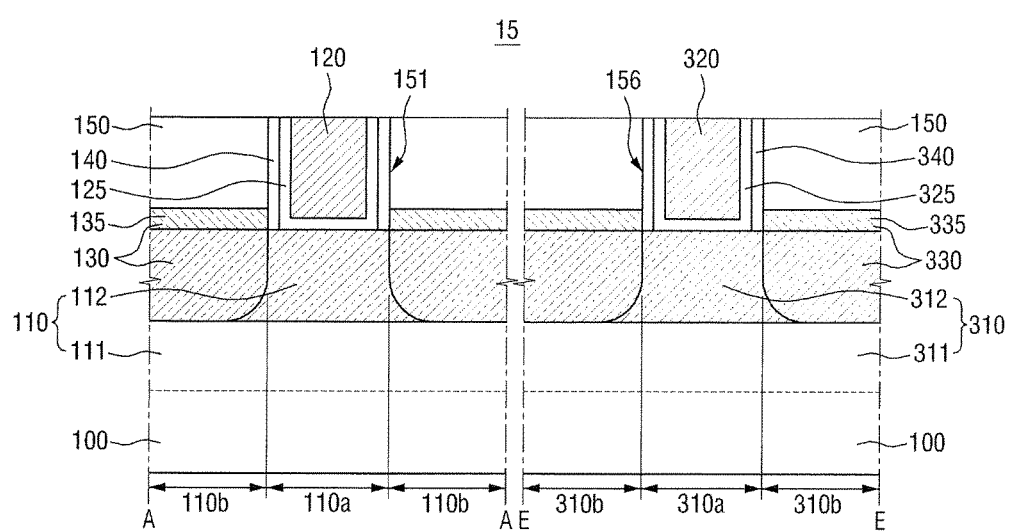
FIGS. 26 and 27 are views of a semiconductor device according to a fifteenth embodiment of the present inventive concept.
Figure 27:
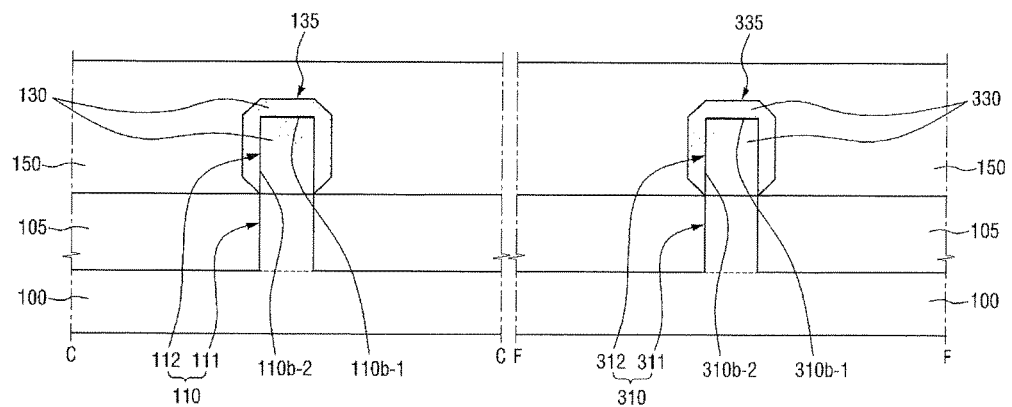
Figure 28:
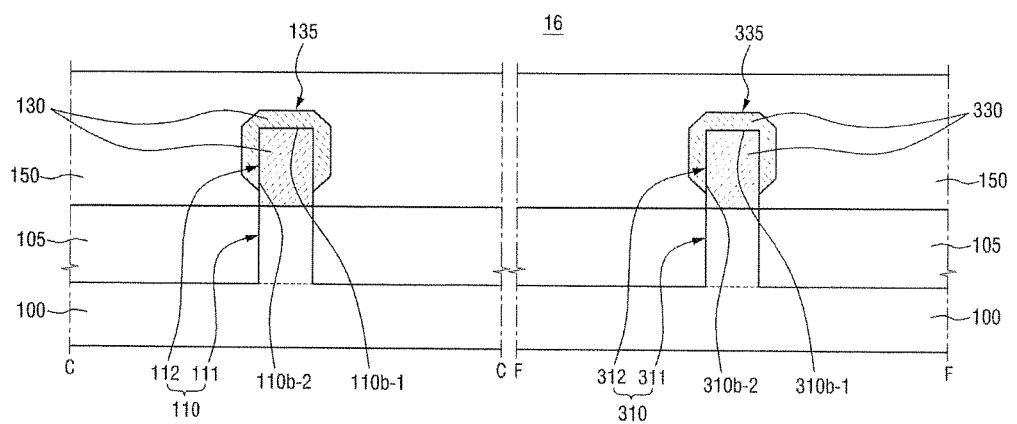
FIG. 28 is a view of a semiconductor device according to a sixteenth embodiment of the present inventive concept.
Figure 29:
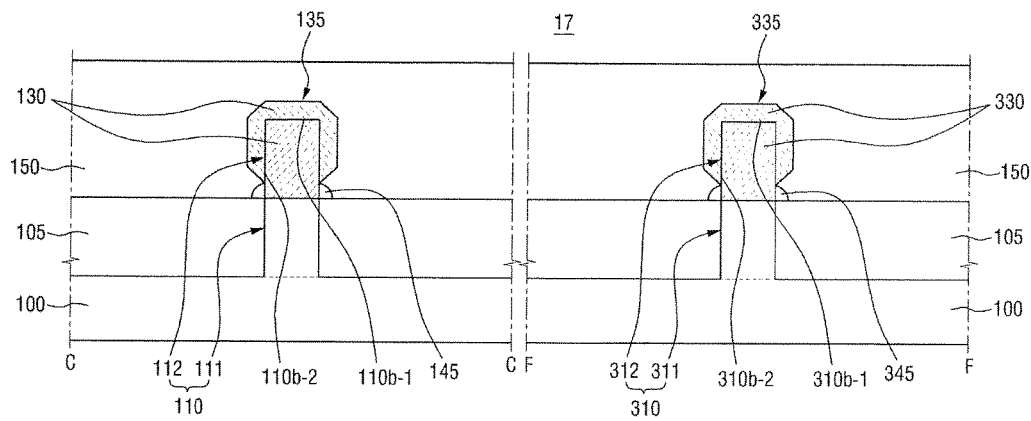
FIG. 29 is a view of a semiconductor device according to a seventeenth embodiment of the present inventive concept.
Figure 30:
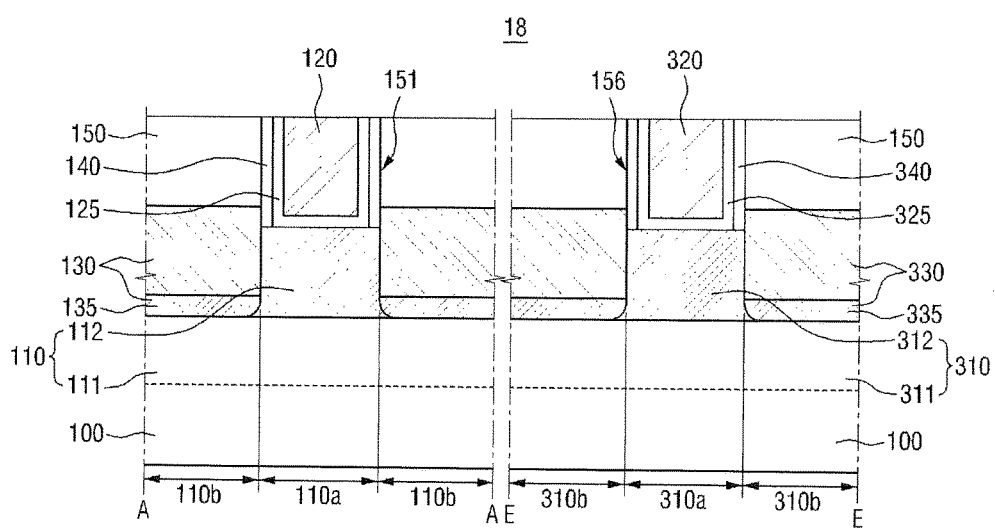
FIGS. 30 and 31 are views of a semiconductor device according to an eighteenth embodiment of the present inventive concept.
Figure 31:
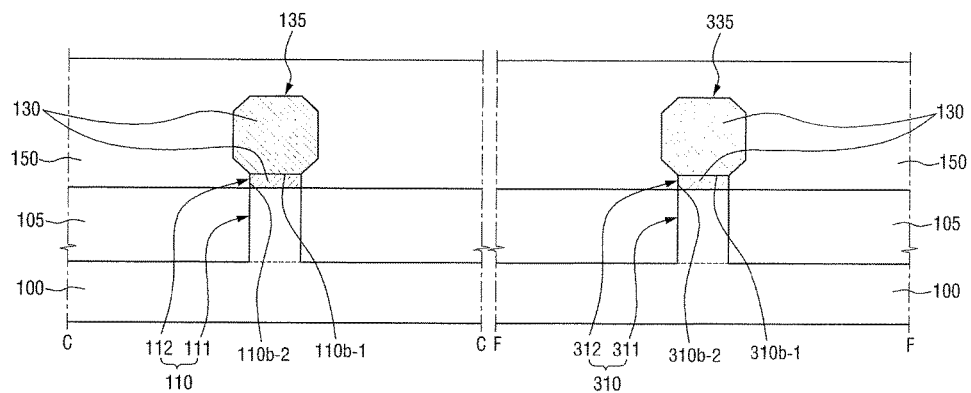
Figure 32:
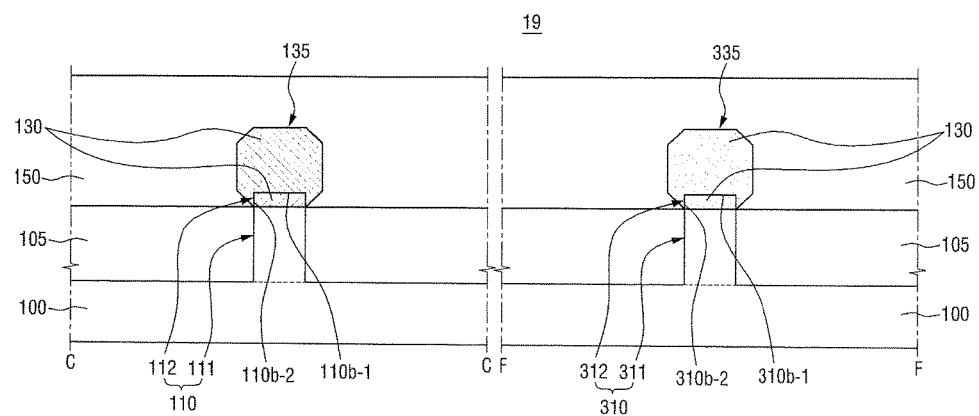
FIG. 32 is a view of a semiconductor device according to a nineteenth embodiment of the present inventive concept.
Figure 33:
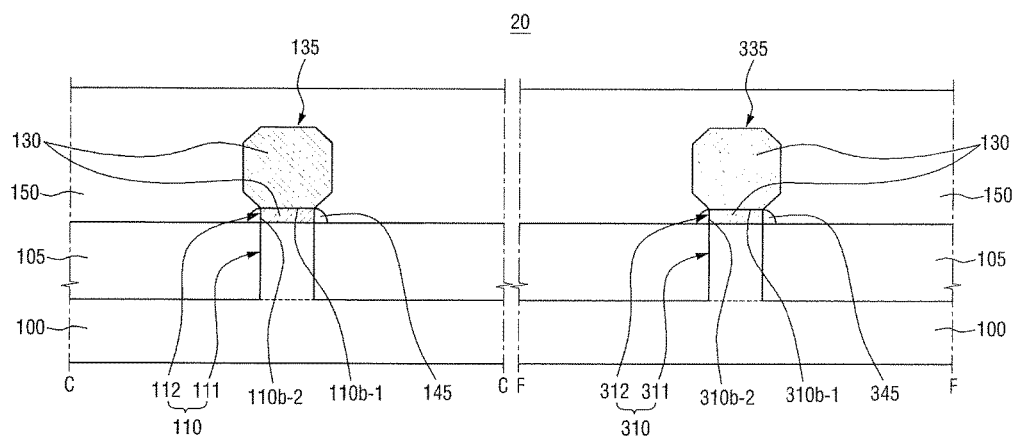
FIG. 33 is a view of a semiconductor device according to a twentieth embodiment of the present inventive concept.
Figure 34:
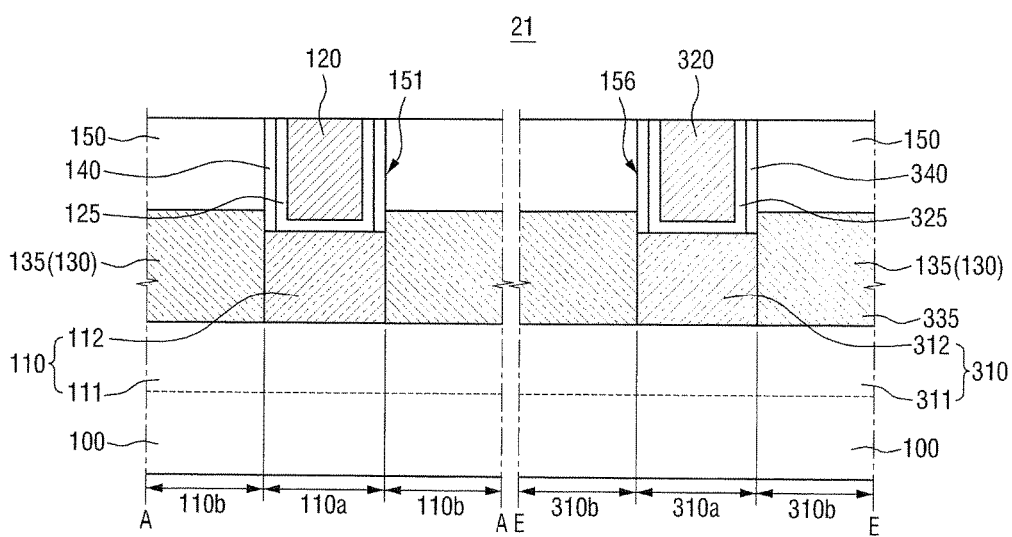
FIGS. 34 and 35 are views of a semiconductor device according to a twenty-first embodiment of the present inventive concept.
Figure 35:
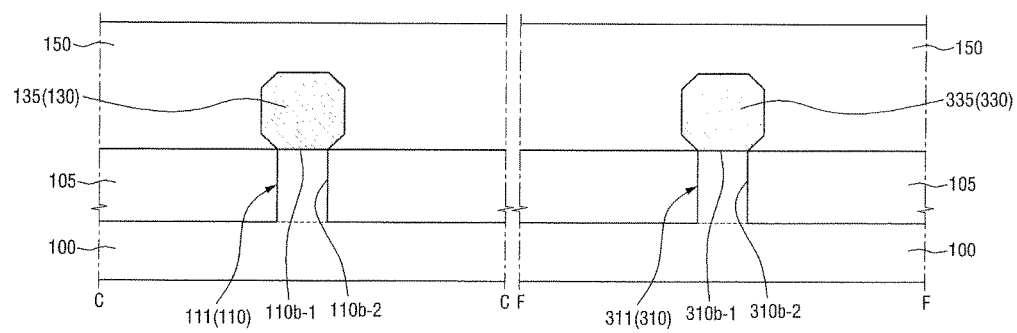
Figure 36:
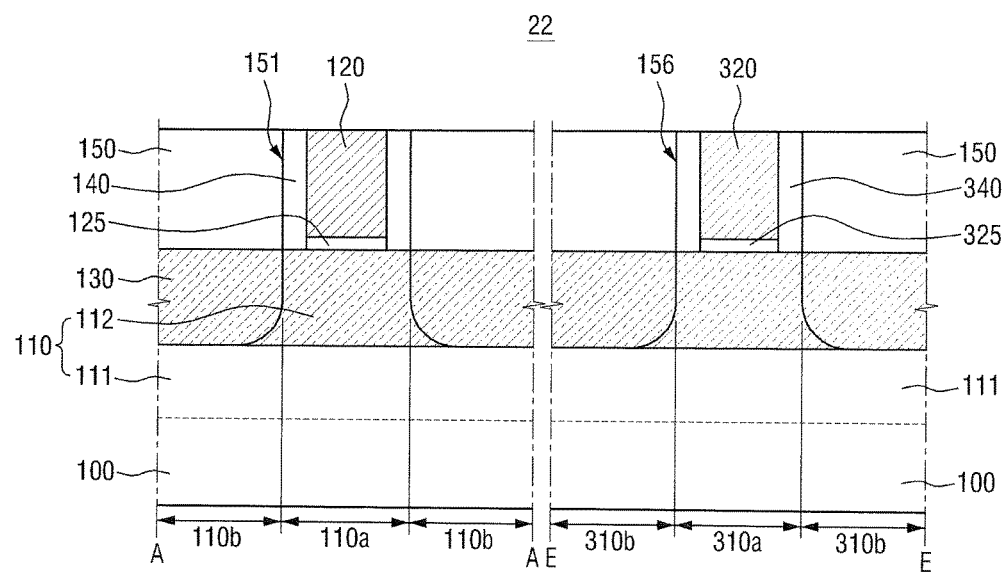
FIG. 36 is a view of a semiconductor device according to a twenty-second embodiment of the present inventive concept.

FIG. 24 is a perspective view of a semiconductor device 14 according to a fourteenth embodiment of the present inventive concept. FIG. 25 is a cross-sectional view taken along the lines A-A and E-E of FIG. 24. FIGS. 26 and 27 are views of a semiconductor device 15 according to a fifteenth embodiment of the present inventive concept. FIG. 28 is a view of a semiconductor device 16 according to a sixteenth embodiment of the present inventive concept. FIG. 29 is a view of a semiconductor device 17 according to a seventeenth embodiment of the present inventive concept. FIGS. 30 and 31 are views of a semiconductor device 18 according to an eighteenth embodiment of the present inventive concept. FIG. 32 is a view of a semiconductor device 19 according to a nineteenth embodiment of the present inventive concept. FIG. 33 is a view of a semiconductor device 20 according to a twentieth embodiment of the present inventive concept. FIGS. 34 and 35 are views of a semiconductor device 21 according to a twenty-first embodiment of the present inventive concept. FIG. 36 is a view of a semiconductor device 22 according to a twenty-second embodiment of the present inventive concept.

Specifically, FIGS. 26, 30, 34 and 36 are cross-sectional views of the semiconductor devices 14 through 22 according to the fourteenth through twenty-second embodiments, taken along the lines A-A and E-E of FIG. 24. FIGS. 27 through 29, 31 through 33 and 35 are cross-sectional views of the semiconductor devices 14 through 22 according to the fourteenth through twenty-second embodiments, taken along the lines C-C and F-F of FIG. 24.

In the semiconductor devices 14 through 22 according to the fourteenth through twenty-second embodiments of the present inventive concept, a first transistor 101 formed in a first area I may be substantially identical to those described above with reference to FIGS. 1 through 15, and thus a description thereof will be given briefly or omitted.

Referring to FIGS. 24 and 25, the semiconductor device 14 according to the fourteenth embodiment of the present inventive concept may include a substrate 100, a first fin-type active pattern 110, a third fin-type active pattern 130, a first gate electrode 120, a third gate electrode 320, first source/drain regions 130, and third source/drain regions 330.

The substrate 100 may include the first area I and a second area II. The first area I and the second area II may be separated from each other or may be connected to each other. In addition, the first area I and the second area II may include transistor regions of different types. For example, the first area I may be where an NMOS transistor is formed, and the second area II may be where a PMOS transistor is formed.

The first transistor 101 includes the first fin-type active pattern 110, the first gate electrode 120, and the first source/drain regions 130.

In the semiconductor devices 14 through 22 according to the fourteenth through twenty-second embodiments of the present inventive concept, a first upper pattern 112 of the first fin-type active pattern 110 may be a silicon carbide pattern containing silicon carbide. In addition, the first source/drain regions 130 may include n-type impurities.

The other features of the first transistor 101 are identical to those described above with reference to FIGS. 1 through 4, and thus a redundant description thereof is omitted.

A second transistor 301 includes the third fin-type active pattern 310, the third gate electrode 320, and the third source/drain regions 330.

The third fin-type active pattern 310 may protrude from the substrate 100. A field insulating layer 105 partially covers sidewalls of the third fin-type active pattern 310. Therefore, a top surface of the third fin-type active pattern 310 protrudes further upward than a top surface of the field insulating layer 105. The third fin-type active pattern 310 is defined by the field insulating layer 105.

The third fin-type active pattern 310 includes a third lower pattern 311 and a third upper pattern 312 stacked sequentially on the substrate 100. The third upper pattern 312 is formed on the third lower pattern 311. The third upper pattern 312 and the third lower pattern 311 are directly connected to each other.

The top surface of the third fin-type active pattern 310 may be a top surface of the third upper pattern 312. At least part of the third upper pattern 312 protrudes further upward than the field insulating layer 105. The third upper pattern 312 may be used as a channel region of the second transistor 301.

The third lower pattern 311 is a silicon pattern containing silicon. The third upper pattern 312 is a silicon germanium pattern containing silicon germanium.

The third lower pattern 311 is directly connected to the substrate 100. Since the substrate 100 may be a silicon substrate and the third lower pattern 311 is a silicon pattern, they may be an integral structure.

In FIG. 24, a contact surface of the third upper pattern 312 and the third lower pattern 311 lies in the same plane with the top surface of the field insulating layer 105. That is, the entire sidewalls of the third lower pattern 311 contact the field insulating layer 105, and the entire sidewalls of the third upper pattern 312 do not contact the field insulating layer 105. However, the present inventive concept is not limited thereto.

The third fin-type active pattern 310 may extend along a third direction X2. The third fin-type active pattern 310 includes a first portion 310a and a second portion 310b. The second portion 310b of the third fin-type active pattern 310 is disposed on both sides of the first portion 310a of the third fin-type active pattern 310 in the third direction X2.

In the semiconductor device 14 according to the fourteenth embodiment of the present inventive concept, a top surface of the first portion 310a of the third fin-type active pattern 310 and a top surface of the second portion 310b of the third fin-type active pattern 310 protrude further upward than the top surface of the field insulating layer 105. In addition, the top surface of the first portion 310a of the third fin-type active pattern 310 and the top surface of the second portion 310b of the third fin-type active pattern 310 lie in the same plane.

The third gate electrode 320 is formed on the third fin-type active pattern 310 and the field insulating layer 105. For example, the third gate electrode 320 is formed on the first portion 310a of the third fin-type active pattern 310. More specifically, the third gate electrode 320 is formed on the sidewalls and top surface of the third upper pattern 312.

The third gate electrode 320 extends along a fourth direction Y2 to intersect the third fin-type active pattern 310.

The third gate electrode 320 may include a metal layer. The third gate electrode 320 may include a portion that controls a work function and a portion that fills a fourth trench 156. The third gate electrode 320 may include at least one of W, Al, TiN, TaN, TiC, and/or TaC. In some embodiments, the third gate electrode 320 may be made of, e.g., Si and/or SiGe.

A third gate insulating layer 325 may be formed between the third fin-type active pattern 310 and the third gate electrode 320. The third gate insulating layer 325 may be formed along the top surface and sidewalls of the first portion 310a of the third fin-type active pattern 310. The third gate insulating layer 325 may be formed along the sidewalls and top surface of the third upper pattern 312 which protrudes further upward than the top surface of the field insulating layer 105. The third gate insulating layer 325 may be formed along sidewalls and a bottom surface of the fourth trench 156.

The third gate insulating layer 325 may include a silicon oxide layer and/or a high-k material having a higher dielectric constant than the silicon oxide layer.

Third source/drain regions 330 are respectively formed on both sides of the third gate electrode 320. For example, each of the third source/drain regions 330 is formed in the second portion 310b of the third fin-type active pattern 310. Each of the third source/drain regions 330 may be formed in the third fin-type active pattern 310, that is, in the second portion 310b of the third fin-type active pattern 310.

The third source/drain regions 330 may include p-type impurities.

The semiconductor device 15 according to the fifteenth embodiment of the present inventive concept will now be described with reference to FIGS. 26 and 27. For simplicity, the current embodiment will hereinafter be described, focusing mainly on differences with the embodiment described above with reference to FIGS. 24 and 25.

Referring to FIGS. 26 and 27, the semiconductor device 15 according to the fifteenth embodiment of the present inventive concept further includes a first epitaxial layer 135 and a third epitaxial layer 335.

In the semiconductor devices 15 through 21 according to the fifteenth through twenty-first embodiments of the present inventive concept, the first epitaxial layer 135 may include silicon carbide. Both a first upper pattern 112 and the first epitaxial layer 135 include silicon carbide. However, the proportion of carbon in the first epitaxial layer 135 may be equal to or greater than the proportion of carbon in the first upper pattern 112.

The other features of the first transistor 101 are identical to those described above with reference to FIGS. 5 and 6, and thus a redundant description thereof is omitted.

Each of third source/drain regions 330 may include the third epitaxial layer 335 and an impurity region formed in a second portion 310b of a third fin-type active pattern 310.

The entire third epitaxial layer 335 is formed on a top surface 310b-1 and sidewalls 310b-2 of the second portion 310b of the third fin-type active pattern 310, which protrudes further upward than a top surface of a field insulating layer 105. The third epitaxial layer 335 may contact the field insulating layer 105.

The third epitaxial layer 335 is formed on sidewalls and a top surface of a third upper pattern 312 of the second portion 310b of the third fin-type active pattern 310.

In FIG. 27, an outer circumferential surface of the third epitaxial layer 335 may have various shapes. For example, the outer circumferential surface of the third epitaxial layer 335 may be at least one of a diamond shape, a circular shape, and/or a rectangular shape. In FIG. 27, an octagonal shape is illustrated.

The third epitaxial layer 335, like the third upper pattern 312, may include silicon germanium.

That is, both the third upper pattern 312 and the third epitaxial layer 335 include silicon germanium. However, the proportion of germanium in the third epitaxial layer 335 may be equal to or greater than the proportion of germanium in the third upper pattern 312.

The semiconductor devices 16 and 17 according to the sixteenth and seventeenth embodiments of the present inventive concept will now be described with reference to FIGS. 28 and 29. For simplicity, the current embodiments will hereinafter be described, focusing mainly on differences with the embodiment described above with reference to FIGS. 26 and 27.

Referring to FIG. 28, in the semiconductor device 16 according to the sixteenth embodiment of the present inventive concept, a first epitaxial layer 135 does not contact a field insulating layer 105 and a third epitaxial layer 335 does not contact the field insulating layer 105.

The third epitaxial layer 335 is formed on part of sidewalls 310b-2 and a top surface 310b-1 of a second portion 310b of a third fin-type active pattern 310 which protrudes further upward than a top surface of the field insulating layer 105. That is, the third epitaxial layer 335 is formed around part of the second portion 310b of the third fin-type active pattern 310, which protrudes further upward than the top surface of the field insulating layer 105.

Referring to FIG. 29, the semiconductor device 17 according to the seventeenth embodiment of the present inventive concept further includes first fin spacers 145 and second fin spacers 345.

The second fin spacers 345 may be formed on part of sidewalls 310b-2 of a second portion 310b of a third fin-type active pattern 310 which protrudes further upward than a top surface of a field insulating layer 105. Therefore, part of the second portion 310b of the third fin-type active pattern 310 protrudes further upward than the second fin spacers 345. That is, part of the sidewalls 310b-2 of the second portion 310b of the third fin-type active pattern 310 is not covered by the second fin spacers 345.

A third epitaxial layer 335 is formed on a top surface 310b-1 and the sidewalls 310b-2 of the second portion 310b of the third fin-type active pattern 310 which protrudes further upward than the second fin spacers 345. That is, the third epitaxial layer 335 is formed around the second portion 310b of the third fin-type active pattern 310 which protrudes further upward than the second fin spacers 345.

The third epitaxial layer 335 may contact the second fin spacers 345.

The semiconductor device 18 according to the eighteenth embodiment of the present inventive concept will now be described with reference to FIGS. 30 and 31. For simplicity, the current embodiment will hereinafter be described, focusing mainly on differences with the embodiment described above with reference to FIGS. 26 and 27.

Referring to FIGS. 30 and 31, in the semiconductor device 18 according to the eighteenth embodiment of the present inventive concept, a top surface of a second portion 110b of a first fin-type active pattern 110 is more recessed than a top surface of a first portion 110a of the first fin-type active pattern 110. In addition, a top surface of a second portion 310b of a third fin-type active pattern 310 is more recessed than a top surface of a first portion 310a of the third fin-type active pattern 310.

The top surface of the first portion 310a of the third fin-type active pattern 310 and the top surface of the second portion 310b of the third fin-type active pattern 310 protrude further upward than a top surface of a field insulating layer 105. However, the top surface of the first portion 310a of the third fin-type active pattern 310 and the top surface of the second portion 310b of the third fin-type active pattern 310 do not lie in the same plane.

A height from a top surface of a substrate 100 to the top surface of the first portion 310a of the third fin-type active pattern 310 is greater than a height from the top surface of the substrate 100 to the top surface of the second portion 310b of the third fin-type active pattern 310.

In addition, a part of sidewalls 310b-2 of the second portion 310b of the third fin-type active pattern 310 contacts the field insulating layer 105, but the other part of the sidewalls 310b-2 of the second portion 310b of the third fin-type active pattern 310 does not contact the field insulating layer 105.

A third epitaxial layer 335 is formed on the recessed second portion 310b of the third fin-type active pattern 310. More specifically, the third epitaxial layer 335 is formed on a top surface 310b-1 of the second portion 310b of the third fin-type active pattern 310, which protrudes further upward than the top surface of the field insulating layer 105 but not on the sidewalls 310b-2 of the second portion 310b of the third fin-type active pattern 310.

The semiconductor devices 19 and 20 according to the nineteenth and twentieth embodiments of the present inventive concept will now be described with reference to FIGS. 32 and 33. For simplicity, the current embodiments will hereinafter be described, focusing mainly on differences with the embodiment described above with reference to FIGS. 30 and 31.

Referring to FIG. 32, in the semiconductor device 19 according to the nineteenth embodiment of the present inventive concept, a first epitaxial layer 135 and a third epitaxial layer 335 may contact a field insulating layer 105.

The third epitaxial layer 335 is formed on sidewalls 310b-2 and a top surface 310b-1 of a second portion 310 of a third fin-type active pattern 310, which protrudes further upward than a top surface of the field insulating layer 105. The third epitaxial layer 335 is formed around the second portion 310b of the third fin-type active pattern 310, which protrudes further upward than the top surface of the field insulating layer 105.

Referring to FIG. 33, the semiconductor device 20 according to the twentieth embodiment of the present inventive concept further includes first fin spacers 145 and second fin spacers 345.

The second fin spacers 345 may be formed on sidewalls 310b-2 of a second portion 310b of a third fin-type active pattern 310, which protrudes further upward than a top surface of a field insulating layer 105. Therefore, the second fin spacers 345 may contact a third epitaxial layer 335.

In the drawing, the second portion 310b of the third fin-type active pattern 310 does not protrude further upward than the second fin spacers 345. However, the present inventive concept is not limited thereto.

The semiconductor device 21 according to the twenty-first embodiment of the present inventive concept will now be described with reference to FIGS. 34 and 35. For simplicity, the current embodiment will hereinafter be described, focusing mainly on differences with the embodiment described above with reference to FIGS. 26 and 27.

Referring to FIGS. 34 and 35, in the semiconductor device 21 according to the twenty-first embodiment of the present inventive concept, the entire sidewalls 110b-2 of a second portion 110b of a first fin-type active pattern 110 and the entire sidewalls 310b-2 of a second portion 310b of a third fin-type active pattern 310 may contact a field insulating layer 105.

A top surface 310b-1 of the second portion 310b of the third fin-type active pattern 310 may not protrude further upward than a top surface of the field insulating layer 105. That is, if the top surface of the field insulating layer 105 is flat as illustrated in the drawings, the top surface 310b-2 of the second portion 310b of the third fin-type active pattern 310 may lie in the same plane with the top surface of the field insulating layer 105.

Since the entire sidewalls 310b-2 of the second portion 310b of the third fin-type active pattern 310 are covered by the field insulating layer 105, a third epitaxial layer 335 is formed on the top surface 310b-1 of the second portion 310b of the third fin-type active pattern 310 but not on the sidewalls 310b-2 of the third portion 310b of the third fin-type active pattern 310.

The semiconductor device 22 according to the twenty-second embodiment of the present inventive concept will now be described with reference to FIG. 36. For simplicity, the current embodiment will hereinafter be described, focusing mainly on differences with the embodiment described above with reference to FIGS. 24 and 25.

Referring to FIG. 36, in the semiconductor device 22 according to the twenty-second embodiment of the present inventive concept, a first gate insulating layer 125 is formed along a bottom surface of a first trench 151 but is not along sidewalls of the first trench 151. In addition, a third gate insulating layer 325 is formed along a bottom surface of a fourth trench 156 but not along sidewalls of the fourth trench 156.

The third gate insulating layer 325 is not formed along sidewalls of third gate spacers 340. The third gate insulating layer 325 does not include a portion that lies in the same plane with a top surface of a third gate electrode 320.

Therefore, the third gate insulating layer 325 is interposed between the third gate electrode 320 and a third fin-type active pattern 310 but not between the third gate electrode 320 and the third gate spacers 340.

In the semiconductor devices 14 through 22 described above with reference to FIGS. 24 through 36, the first transistor 101 and the second transistor 301. However, this is merely an example used for ease of description, and the present inventive concept is not limited to this example.

That is, the second transistor 301 illustrated in FIGS. 24 and 25 can have not only the structure described above with reference to FIGS. 1 through 4 but also the structures described above with reference to FIGS. 5 through 15.

A method of fabricating a semiconductor device according to an embodiment of the present inventive concept will now be described with reference to FIGS. 37 through 45. A semiconductor device fabricated through the processes of FIGS. 37 through 45 may be the semiconductor device 8 described above with reference to FIGS. 13 and 14.

FIGS. 37 through 45 are views illustrating operations of methods of fabricating a semiconductor device according to some embodiments of the present inventive concept.

Figure 37:
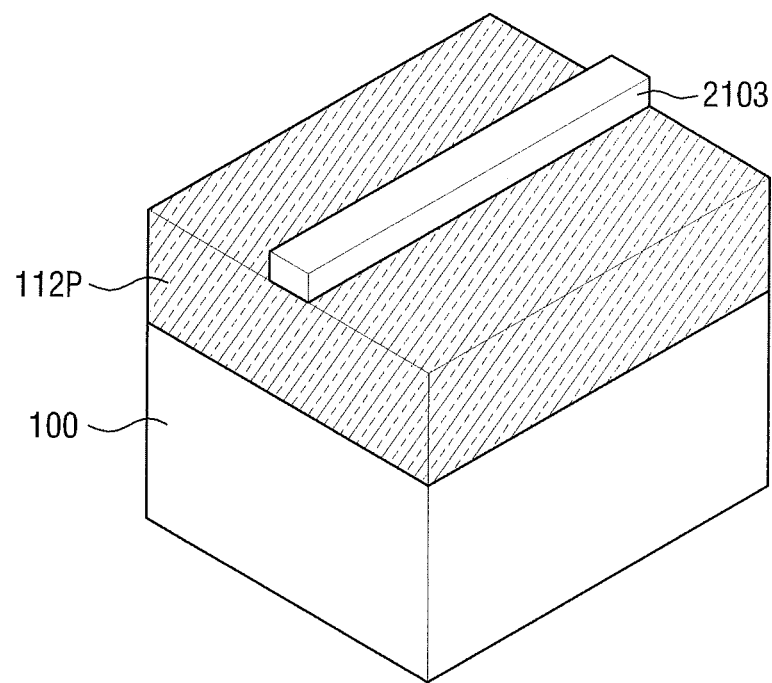
FIGS. 37 through 45 are views illustrating operations of methods for fabricating a semiconductor device according to some embodiments of the present inventive concept.

Referring to FIG. 37, a compound semiconductor layer 112p is formed on a substrate 100. The compound semiconductor layer 112p is formed to directly contact the substrate 100. The compound semiconductor layer 112p may be formed by, e.g., an epitaxial growth process.

The compound semiconductor layer 112p includes a material having a different lattice constant from that of the material of the substrate 100. If the substrate 100 is a silicon substrate, the compound semiconductor layer 112p includes a material having a greater or smaller lattice constant than silicon.

When used as a channel region of an NMOS, the compound semiconductor layer 112p may be a silicon carbide layer.

On the other hand, when used as a channel region of a PMOS, the compound semiconductor layer 112p may be, e.g., a silicon germanium layer.

The compound semiconductor layer 112p formed on the substrate 100 may be fully strained. That is, the lattice constant of the compound semiconductor layer 112p may be equal to the lattice constant of the substrate 100. To make the compound semiconductor layer 112p fully strained, a thickness of the compound semiconductor layer 112p formed on the substrate 100 may be equal to or less than a critical thickness.

A first mask pattern 2103 is formed on the compound semiconductor layer 112p. The first mask pattern 2103 may extend along a first direction X1.

The first mask pattern 2103 may contain a material including at least one of a silicon oxide layer, a silicon nitride layer, and/or a silicon oxynitride layer.

Figure 38:
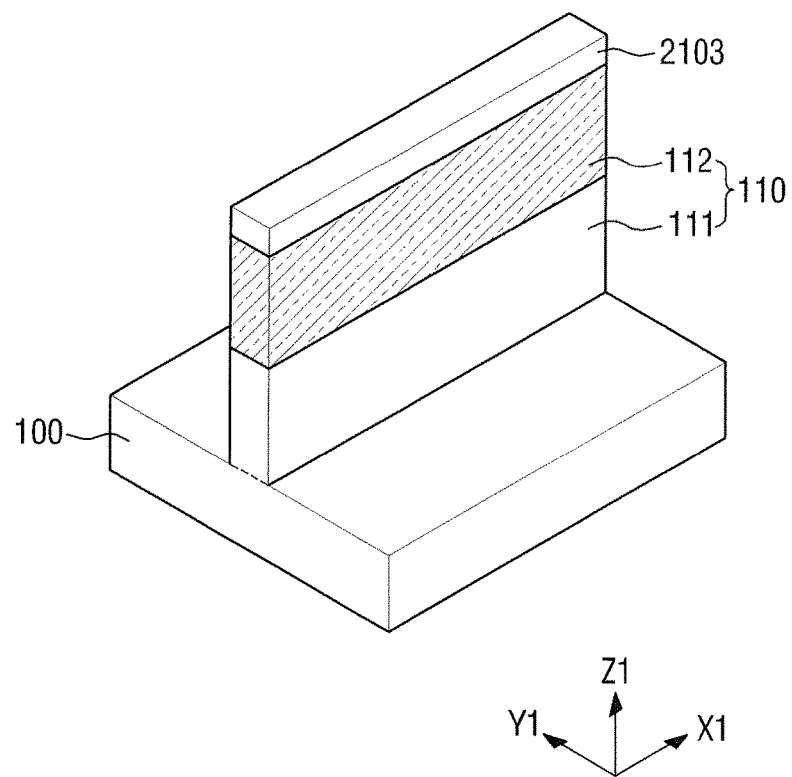

Referring to FIG. 38, the compound semiconductor layer 112p and part of the substrate 100 are patterned to form a first fin-type active pattern 110 on the substrate 100.

Specifically, the compound semiconductor layer 112p and part of the substrate 100 are etched using the first mask pattern 2103 formed on the compound semiconductor layer 112p as a mask. As a result, the first fin-type active pattern 110 is formed on the substrate 100 to extend along the first direction X1.

A first upper pattern 112 is formed by patterning the compound semiconductor layer 112p, and a first lower pattern 111 is formed by patterning part of the substrate 100. That is, the first fin-type active pattern 110 protruding upward from the substrate 100 includes the first lower pattern 111 and the first upper pattern 112 stacked sequentially on the substrate 100.

Figure 39:
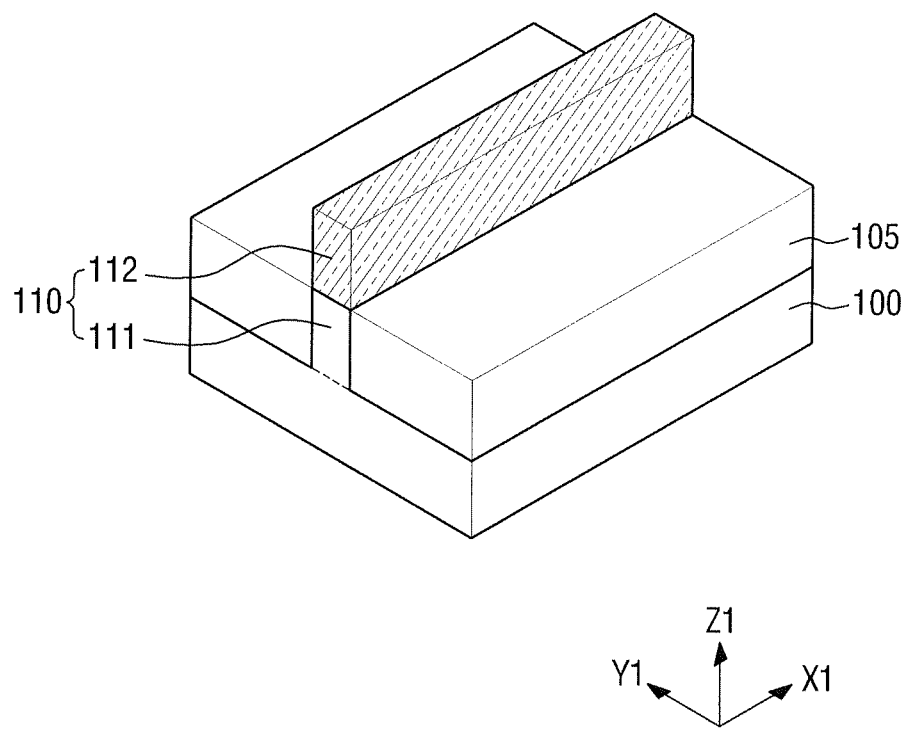

Referring to FIG. 39, a field insulating layer 105 is formed on the substrate 100. The field insulating layer 105 may be made of a material including at least one of a silicon oxide layer, a silicon nitride layer, and/or a silicon oxynitride layer.

For example, the field insulating layer 105 is formed on the substrate 100 to cover the first fin-type active pattern 110 and the first mask pattern 2103. Then, a planarization process is performed to make a top surface of the first fin-type active pattern 110 and a top surface of the field insulating layer 105 lie in the same plane.

The first mask pattern 2103 may be removed in the planarization process, but the present inventive concept is not limited thereto. That is, the first mask pattern 2103 may be removed before the formation of the field insulating layer 105 or after a process of recessing the field insulating layer 105.

Next, part of the field insulating layer 105 is recessed. As a result, the first fin-type active pattern 110 protrudes further upward than the top surface of the field insulating layer 105. That is, the field insulating layer 105 is formed to contact part of sidewalls of the first fin-type active pattern 110. Thus, the first fin-type active pattern 110 may be defined by the field insulating layer 105.

The partial removal of the field insulating layer 105 causes at least part of the first upper pattern 112 to protrude further upward than the field insulating layer 105.

In addition, the first fin-type active pattern 110 may be doped with impurities for controlling a threshold voltage. To fabricate an NMOS fin-type transistor using the first fin-type active pattern 110, boron (B) may be utilized as the impurities for controlling the threshold voltage. To fabricate a PMOS fin-type transistor using the first fin-type active pattern 110, phosphorous (P) and/or arsenic (As) may be utilized as the impurities for controlling the threshold voltage. That is, the first upper pattern 112 used as a channel region of a transistor may be doped with the impurities for controlling the threshold voltage.

Figure 40:
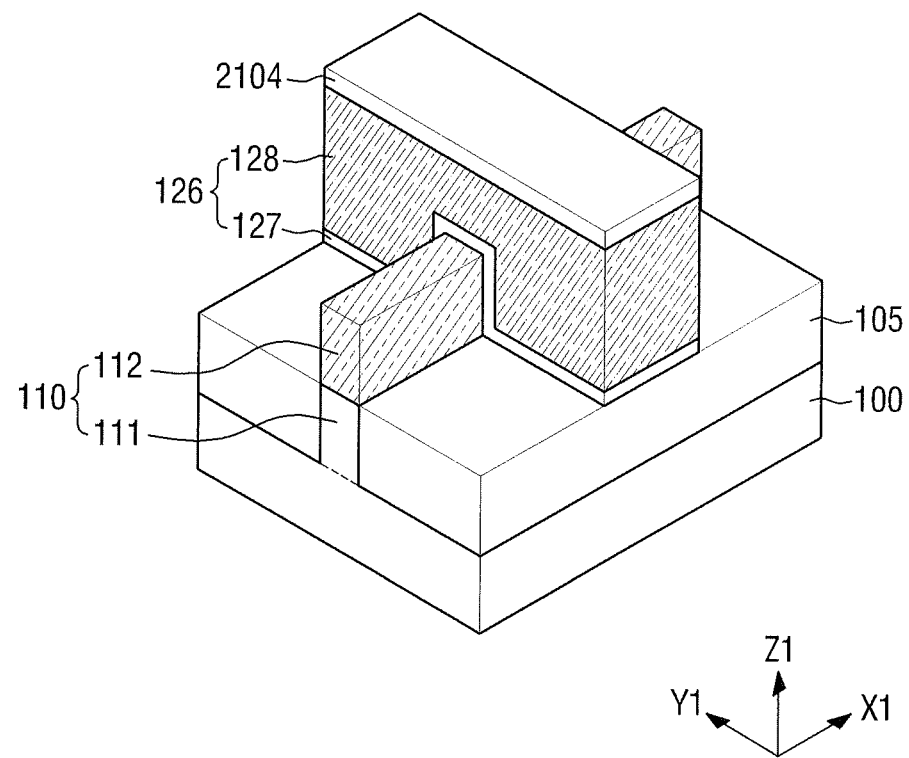

Referring to FIG. 40, an etching process is performed using a second mask pattern 2104, thereby forming a dummy gate pattern 126 which intersects the first fin-type active pattern 110 and extends along a second direction Y1.

The dummy gate pattern 126 is formed on the field insulating layer 105 and the first fin-type active pattern 110 formed on the substrate 100. The dummy gate pattern 126 includes a dummy gate insulating layer 127 and a dummy gate electrode 128. For example, the dummy gate insulating layer 127 may be a silicon oxide layer, and the dummy gate electrode 128 may be polysilicon.

In the methods of fabricating a semiconductor device according to current embodiments, the dummy gate pattern 126 is formed to form a replacement gate electrode. However, the present inventive concept is not limited thereto.

That is, a gate pattern, not the dummy gate pattern 126, can be formed on the first fin-type active pattern 110 using a material that will be utilized as a gate insulating layer and a gate electrode of a transistor. Here, the gate pattern may include a high-k gate insulating layer having a higher dielectric constant than a silicon oxide layer and/or a metal gate electrode.

Figure 41:
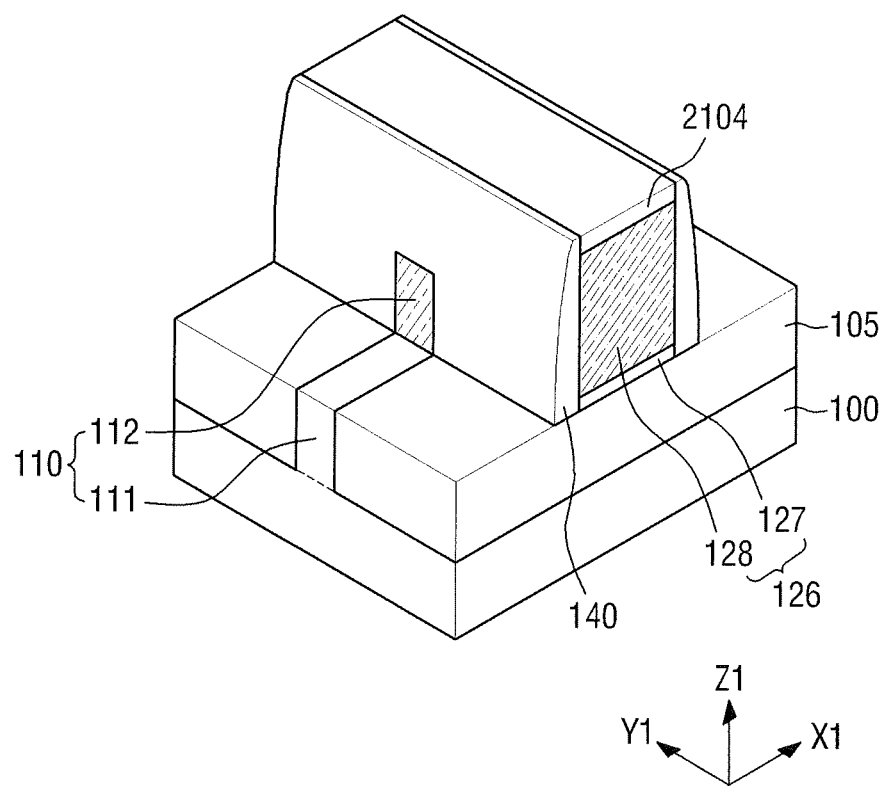

Referring to FIG. 41, first gate spacers 140 are formed on sidewalls of the dummy gate pattern 126. In other words, the first gate spacers 140 are formed on side surfaces of the dummy gate electrode 128.

Specifically, a spacer layer is formed on the dummy gate pattern 126 and the first fin-type active pattern 110 and then etched-back to form the first gate spacers 140. The first gate spacers 140 may expose a top surface of the second mask pattern 2104 and a top surface of the fin-type active pattern 110 that does not overlap the dummy gate pattern 126.

Next, recesses are formed in the first fin-type active pattern 110 by partially removing the first fin-type active pattern 110 exposed on both sides of the dummy gate pattern 126. That is, recesses are formed on both sides of the dummy gate electrode 128 by partially removing the first fin-type active pattern 110 that does not overlap the dummy gate electrode 128.

Figure 42:
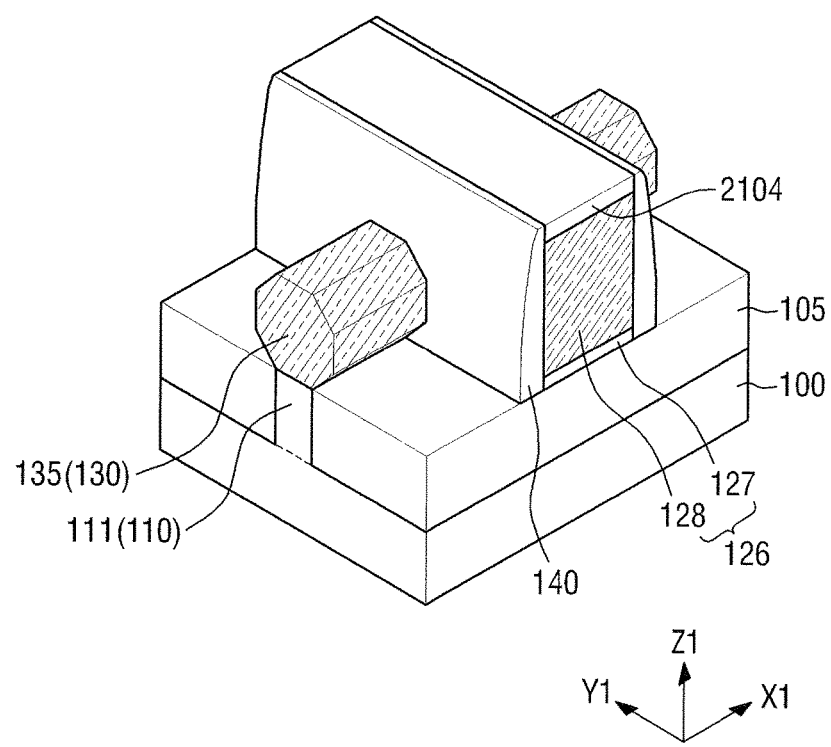

Referring to FIG. 42, first source/drain regions 130, each including a first epitaxial layer 135, are formed on both sides of the dummy gate pattern 126.

The first epitaxial layer 135 fills the recesses formed on both sides of the dummy gate pattern 126. That is, the first epitaxial layer 135 is formed on the first fin-type active pattern 110.

The first epitaxial layer 135 may be formed using an epitaxial growth method. The first epitaxial layer 135 may be in-situ-doped with impurities in an epitaxial process, if necessary.

In the drawing, the first epitaxial layer 135 is octagonal. However, the shape of the first epitaxial layer 135 is not limited to the octagonal shape. That is, the first epitaxial layer can be formed to have various shapes such as a diamond shape, a rectangular shape and/or a pentagonal shape by controlling the conditions of the epitaxial process for forming the first epitaxial layer 135.

If the first upper pattern 112 used as the channel region is a silicon carbide pattern, the first epitaxial layer 135 may include silicon carbide.

If the first upper pattern 112 used as the channel region is a silicon germanium pattern, the first epitaxial layer 135 may include silicon germanium.

Figure 43:
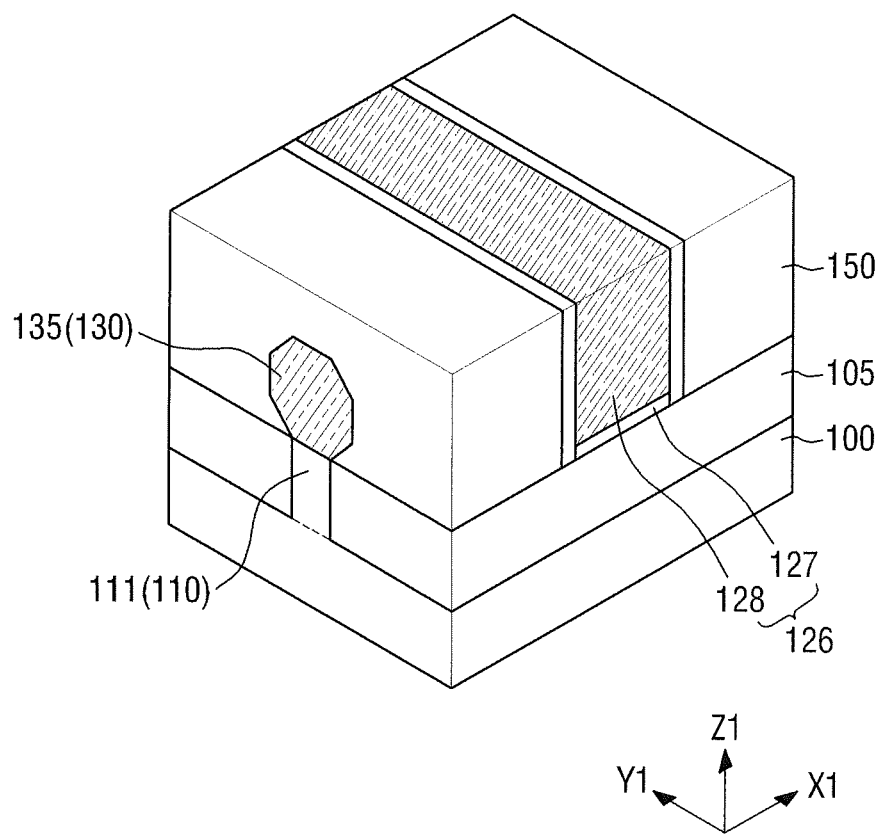

Referring to FIG. 43, an interlayer insulating film 150 is formed on the substrate 100 to cover the first source/drain regions 130 and the dummy gate pattern 126. The interlayer insulating film 150 may include at least one of an oxide layer, a nitride layer, and/or an oxynitride layer.

The interlayer insulating film 150 is planarized until a top surface of the dummy gate pattern 126 is exposed. As a result, the second mask pattern 2104 is removed, and a top surface of the dummy gate electrode 128 is exposed.

Figure 44:
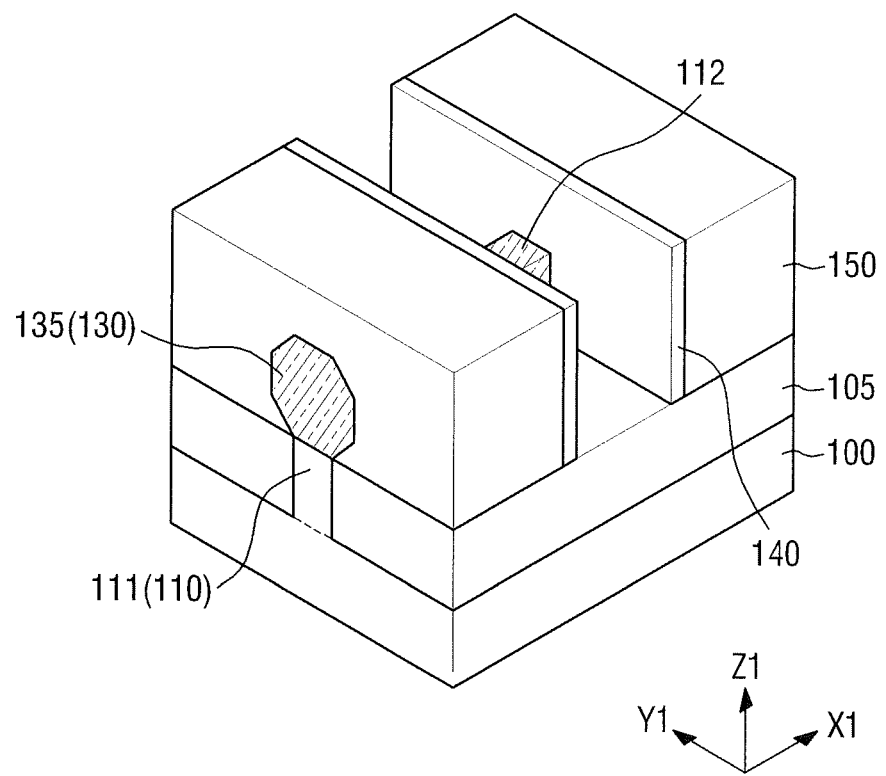

Referring to FIG. 44, the dummy gate pattern 126, that is, the dummy gate insulating layer 127 and the dummy gate electrode 128 are removed.

The removal of the dummy gate insulating layer 127 and the dummy gate electrode 128 results in the formation of a trench that exposes the field insulating layer 105 and part of the first fin-type active pattern 110. The first upper pattern 112 is exposed by the trench.

Figure 45:
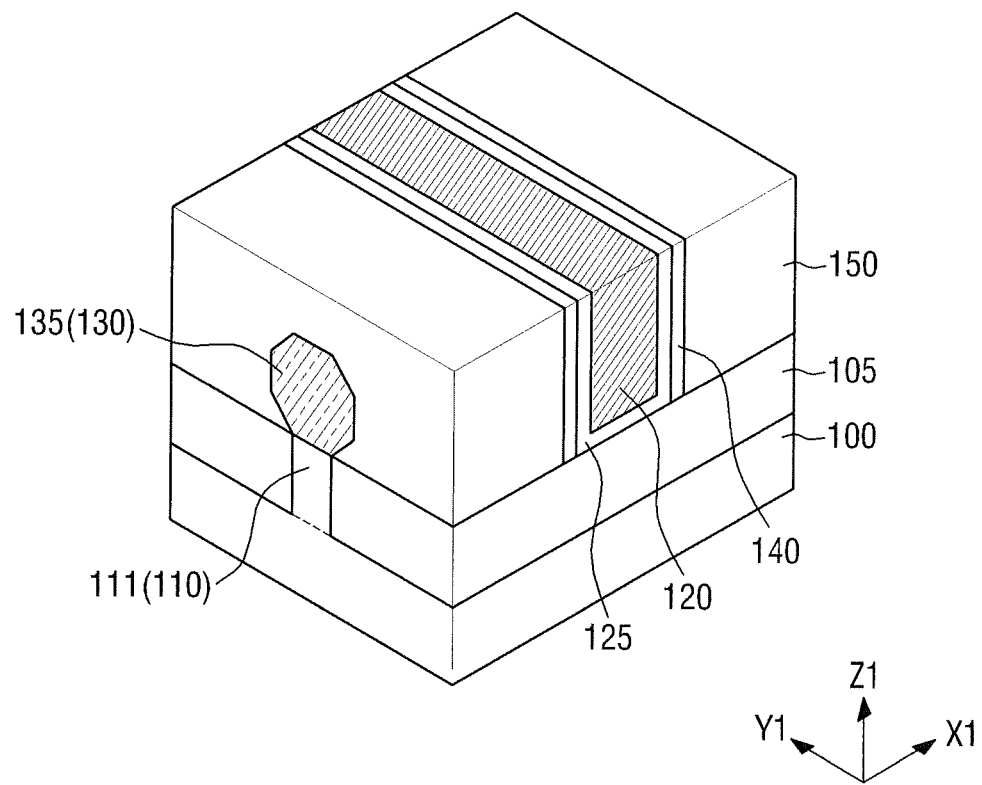

Referring to FIG. 45, a first gate insulating layer 125 and a first gate electrode 120 are formed in the trench.

The first gate insulating layer 125 may be formed substantially conformally along sidewalls and a bottom surface of the trench. The first gate electrode 120 may fill the trench in which the first gate insulating layer 125 is formed.

Methods of fabricating a semiconductor device according to some other embodiments of the present inventive concept will now be described with reference to FIGS. 37 through 40 and 43 through 47. A semiconductor device fabricated by the processes of FIGS. 37 through 40 and 43 through 47 may be the semiconductor device 2 described above with reference to FIGS. 5 and 6.

Figure 46:
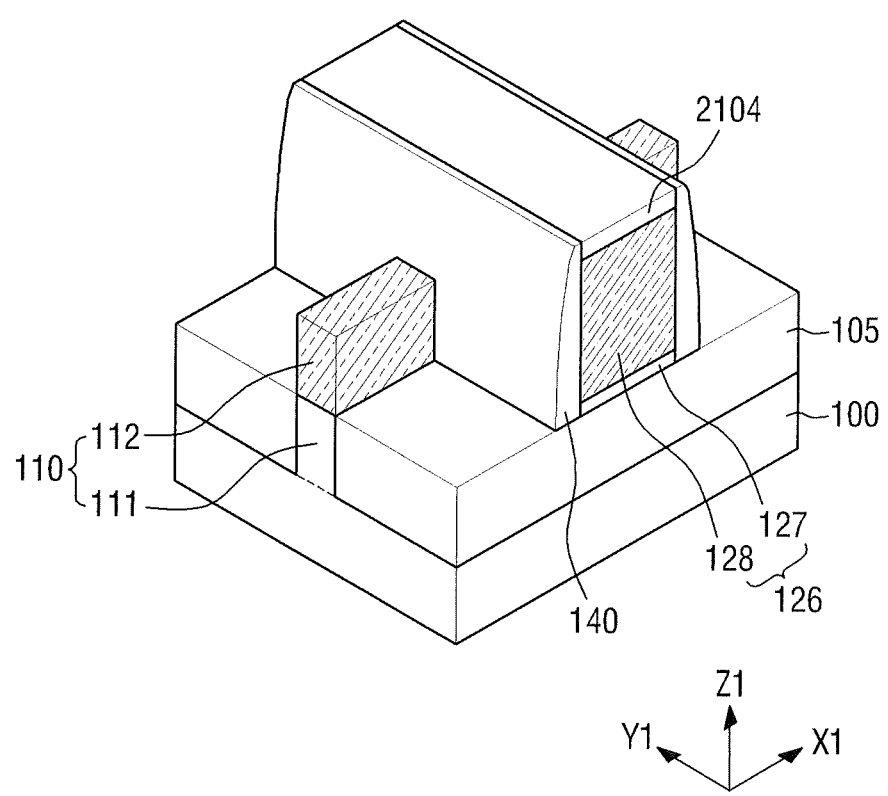
FIGS. 46 and 47 are views illustrating operations of methods of fabricating a semiconductor device according to some embodiments of the present inventive concept.
Figure 47:
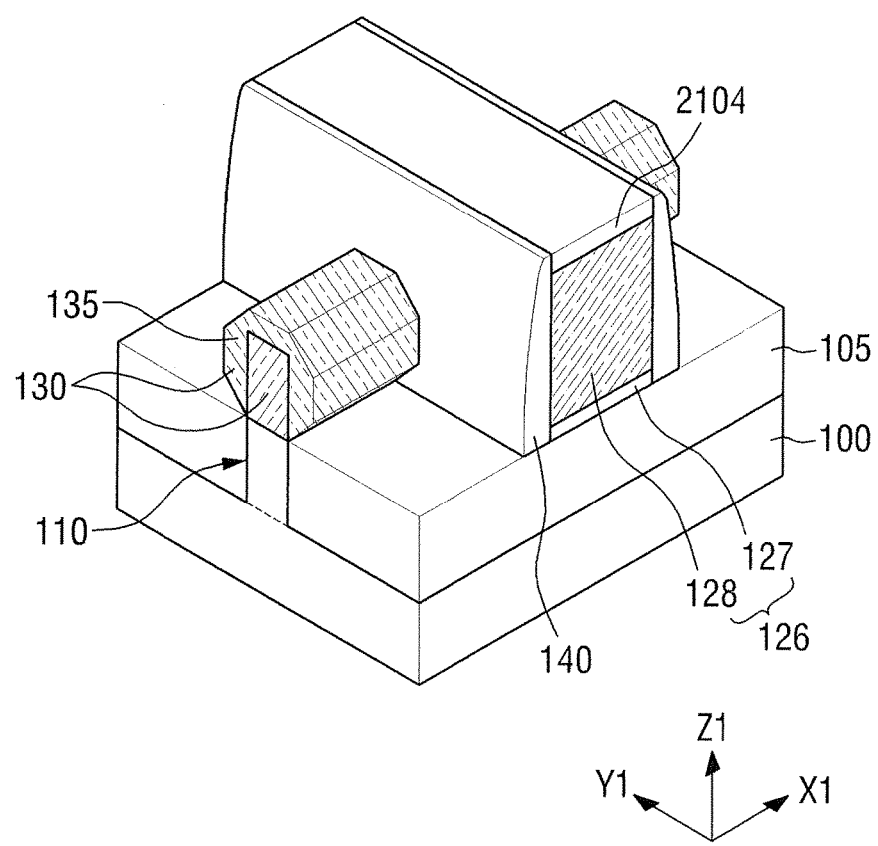

FIGS. 46 and 47 are views illustrating operations of method of fabricating a semiconductor device according to some other embodiments of the present inventive concept.

Referring to FIG. 46, first gate spacers 140 are formed on sidewalls of a dummy gate pattern 126. In the process of forming the first gate spacers 140, a first fin-type active pattern 110 which does not overlap the dummy gate pattern 126 is not etched.

More specifically, fin spacers may also be formed on sidewalls of the first fin-type active pattern 110 in the process of forming the first gate spacers 140. By controlling the conditions of an etch-back process for forming the first gate spacers 140, only the fin spacers formed on the sidewalls of the first fin-type active pattern 110 may be removed, whereas the first fin-type active pattern 110 is not etched.

That is, an etching material having an etch selectivity with respect to a first upper pattern 112 may be used to etch only the material that forms the first gate spacers 140 and the fin spacers and to not etch the first upper pattern 112.

As a result, the first fin-type active pattern 110 that does not overlap the dummy gate pattern 126 and the first gate spacers 140 still protrudes further upward than a field insulating layer 105.

Referring to FIG. 47, a first epitaxial layer 135 is formed on both sides of the dummy gate pattern 126.

The first epitaxial layer 135 is formed on the sidewalls and top surface of the first fin-type active pattern 110 that protrudes further than the field insulating layer 105. For example, the first epitaxial layer 135 is formed on sidewalls and a top surface of the first upper pattern 112 that protrudes further upward than the field insulating layer 105. The first epitaxial layer 135 is formed around the first upper pattern 112 that protrudes further upward than the field insulating layer 105.

As a result, first source/drain regions 130, each including the first epitaxial layer 135 and an impurity region formed in the first fin-type active pattern 110, are formed.

Figure 48:
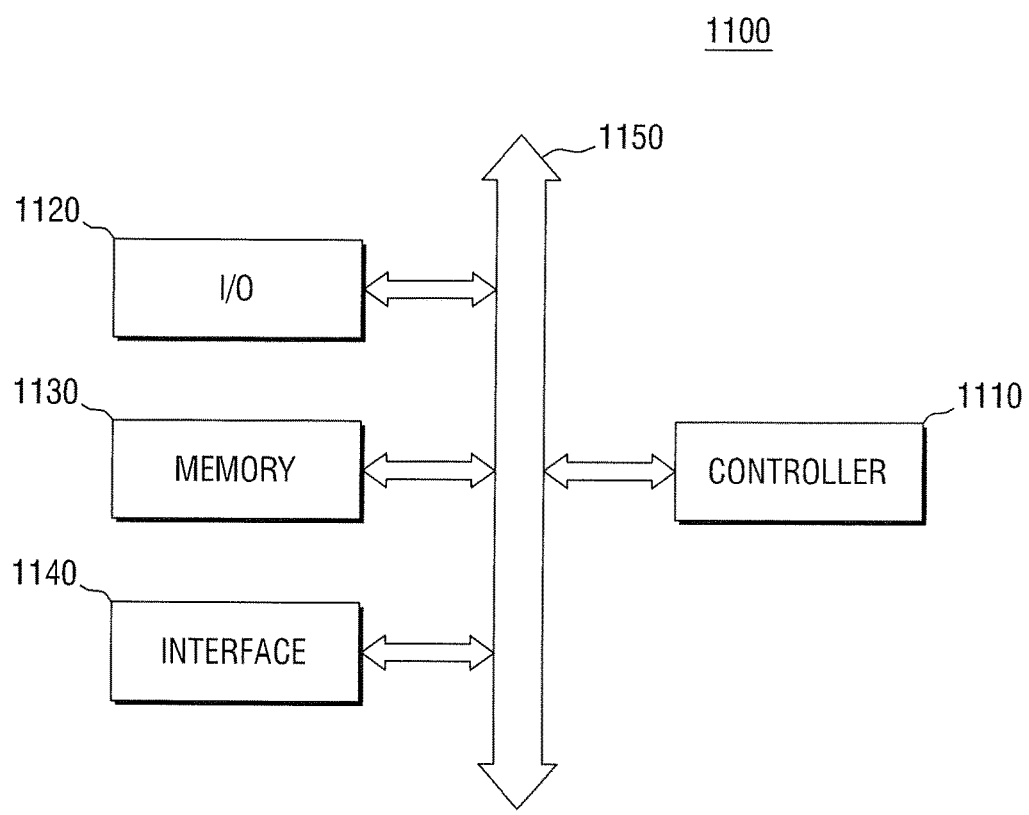
FIG. 48 is a block diagram of an electronic system including semiconductor devices according to some embodiments of the present inventive concept.

FIG. 48 is a block diagram of an electronic system 1100 including semiconductor devices according to some embodiments of the present inventive concept.

Referring to FIG. 48, the electronic system 1100 may include a controller 1110, an input/output (I/O) device 1120, a memory device 1130, an interface 1140 and a bus 1150. The controller 1110, the I/O device 1120, the memory device 1130 and/or the interface 1140 may be connected to one another by the bus 1150. The bus 1150 may serve as a path for transmitting data.

The controller 1110 may include at least one of a microprocessor, a digital signal processor, a microcontroller and/or logic devices capable of performing similar functions to those of a microprocessor, a digital signal processor and/or a microcontroller. The I/O device 1120 may include a keypad, a keyboard and a display device. The memory device 1130 may store data and/or commands. The interface 1140 may be used to transmit data to or receive data from a communication network. The interface 1140 may be a wired or wireless interface. In an example, the interface 1140 may include an antenna and/or a wired and/or wireless transceiver. Although not illustrated in the drawing, the electronic system 1100 may be an operating memory for improving the operation of the controller 1110, and may further include a high-speed DRAM or SRAM. Any one of the semiconductor devices according to the above-described embodiments of the present inventive concept may be provided in the memory device 1130 and/or in the controller 1110 and/or the I/O device 1120.

The electronic system 1100 may be applied to nearly all types of electronic products capable of transmitting or receiving information in a wireless environment, such as a personal data assistant (PDA), a portable computer, a web tablet, a wireless phone, a mobile phone, a digital music player, and/or a memory card, among others.

Figure 49:
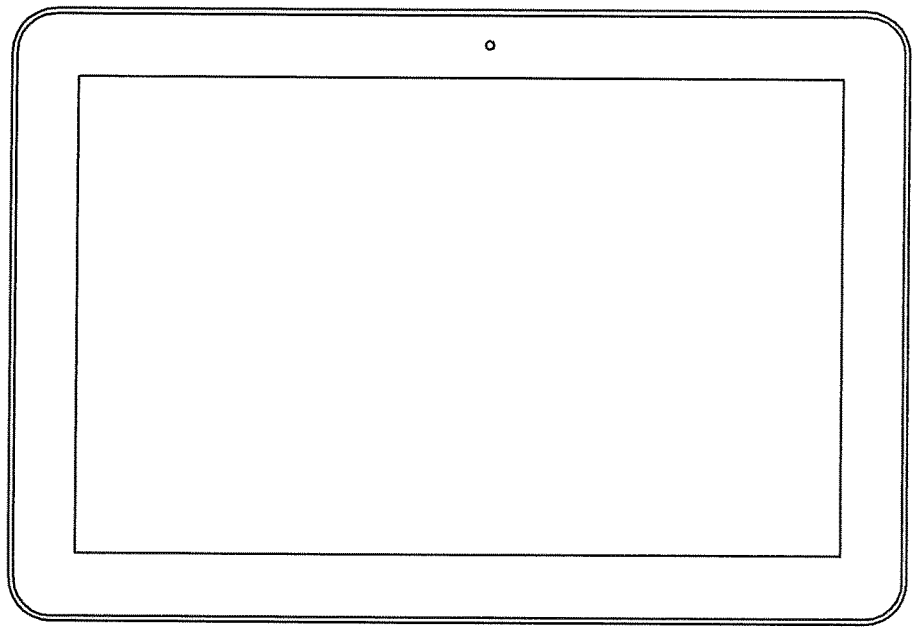
FIGS. 49 and 50 are diagrams illustrating examples of a semiconductor system to which semiconductor devices according to some embodiments of the present inventive concept can be applied.
Figure 50:
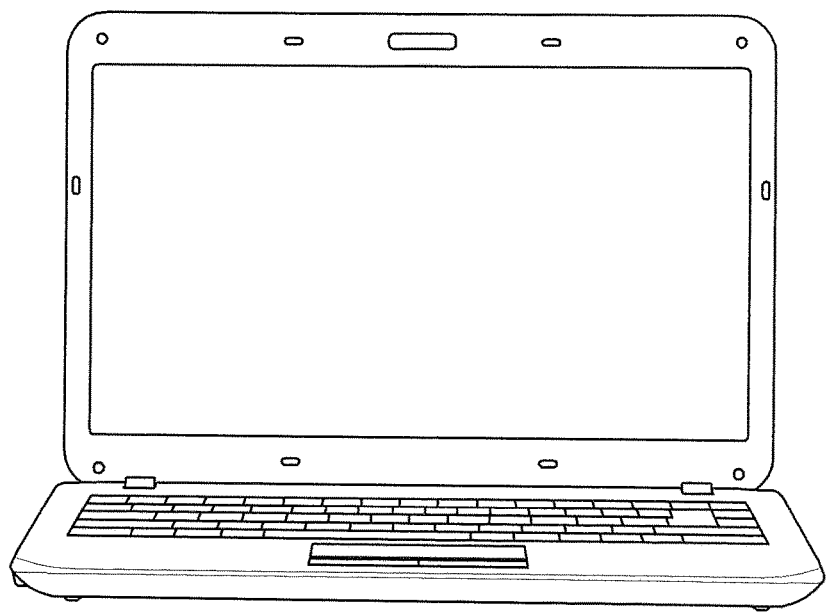

FIGS. 49 and 50 are diagrams illustrating examples of a semiconductor system to which semiconductor devices according to some embodiments of the present inventive concept can be applied. FIG. 49 illustrates a tablet personal computer (PC), and FIG. 50 illustrates a notebook computer. At least one of the semiconductor devices according to some embodiments of the present inventive concept may be used in a tablet PC, a notebook computer, etc. The semiconductor devices according to some embodiments of the present inventive concept, as set forth herein, may also be applied to various IC devices other than those set forth herein.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. A semiconductor device, comprising:
 a first fin and a second fin protruded from a substrate and collinearly aligned in a first direction, the first fin and the second fin extending in the first direction;
 a field insulation layer comprising a first portion and a second portion disposed on the first fin and the second fin, the first portion being disposed between the first fin and the second fin, the second portion extending in the first direction, wherein a first height from the substrate to an upper surface of the first portion is substantially the same as a second height from the substrate to an upper surface of the second portion; and
 only one dummy gate extending in a second direction different from the first direction, and disposed on the upper surface of the first portion.

2. The semiconductor device of claim 1, wherein the dummy gate comprises a high-k dielectric layer and a conductive layer on the high-k dielectric layer, and
 wherein the dummy gate is in contact with the first fin and the second fin.

3. The semiconductor device of claim 1, further comprising a first source/drain on the first fin and a second source/drain on the second fin,
 wherein the dummy gate extends between the first source/drain and the second source/drain.

4. The semiconductor device of claim 1, further comprising a spacer on a sidewall of the dummy gate,
 wherein at least a portion of the spacer overlaps the first fin and the second fin.

5. The semiconductor device of claim 4, further comprising a first source/drain on the first fin and a second source/drain on the second fin,
 wherein the spacer is in contact with the first source/drain and the second source/drain.

6. The semiconductor device of claim 1, wherein each of an upper surface of the first fin and an upper surface of the second fin is higher than the upper surface of the first portion and the upper surface of the second portion.

7. The semiconductor device of claim 1, wherein the first portion extends in the second direction.

8. A semiconductor device, comprising:
a first fin and a second fin disposed in a first region of a substrate, and longitudinally aligned in a first direction, the first fin and the second fin extending in the first direction;
a third fin and a fourth fin disposed in a second region of the substrate, and longitudinally aligned in the first direction, the third fin and the fourth fin extending in the first direction;
a field insulation layer comprising a first portion and a second portion in the first region of the substrate and a third portion and a fourth portion in the second region of the substrate, the first portion and the second portion being disposed on the first fin and the second fin, the third portion and the fourth portion being disposed on the third fin and the fourth fin, the first portion being disposed between the first fin and the second fin, the third portion being disposed between the third fin and the fourth fin, the second portion extending in the first direction, and the fourth portion extending in the first direction;
only one first dummy gate disposed on an upper surface of the first portion;
a second dummy gate disposed on an upper surface of the third portion and on the third fin; and
a third dummy gate disposed on the upper surface of the third portion and on the fourth fin.

9. The semiconductor device of claim 8, wherein a first height from the substrate to the upper surface of the first portion is substantially the same as a second height from the substrate to an upper surface of the second portion.

10. The semiconductor device of claim 8, wherein a first height from the substrate to the upper surface of the third portion is substantially the same as a second height from the substrate to an upper surface of the fourth portion.

11. The semiconductor device of claim 8, wherein a first height from the substrate to the upper surface of the first portion is substantially the same as a second height from the substrate to the upper surface of the third portion.

12. The semiconductor device of claim 8, the first dummy gate is in contact with the first fin and the second fin.

13. The semiconductor device of claim 8, wherein each of an upper surface of the first fin and an upper surface of the second fin is higher than the upper surface of the first portion and an upper surface of the second portion, and
wherein each of an upper surface of the third fin and an upper surface of the fourth fin is higher than the upper surface of the third portion and an upper surface of the fourth portion.

14. The semiconductor device of claim 8, further comprising a spacer on a sidewall of the first dummy gate, wherein at least a portion of the spacer overlaps the first fin and the second fin.

15. The semiconductor device of claim 8, further comprising spacers on both sidewalls of the second dummy gate, wherein one of the spacers is disposed on the upper surface of the third portion.

16. The semiconductor device of claim 8, wherein a first spacing between the first fin and the second fin is smaller than a second spacing between the third fin and the fourth fin.

17. The semiconductor device of claim 8, wherein each of the first portion and the third portion extends in a second direction.

18. The semiconductor device of claim 8, wherein the second fin is the same as the third fin.

19. A semiconductor device, comprising:
a first fin and a second fin disposed in a first region of a substrate, and longitudinally aligned in a first direction, the first fin and the second fin extending in the first direction;
a third fin and a fourth fin disposed in a second region of the substrate, and longitudinally aligned in the first direction, the third fin and the fourth fin extending in the first direction;
a field insulation layer comprising a first portion and a second portion in the first region of the substrate and a third portion and a fourth portion in the second region of the substrate, the first portion and the second portion being disposed on the first fin and the second fin, the third portion and the fourth portion being disposed on the third fin and the fourth fin, the first portion being disposed between the first fin and the second fin, the third portion being disposed between the third fin and the fourth fin, the second portion extending in the first direction, the fourth portion extending in the first direction, a first height from the substrate to an upper surface of the first portion being substantially the same as a second height from the substrate to an upper surface of the second portion, and the second height being substantially the same as a third height from the substrate to an upper surface of the fourth portion;
only one first dummy gate disposed on the upper surface of the first portion;
a second dummy gate disposed on an upper surface of the third portion and on the third fin; and
a third dummy gate disposed on the upper surface of the third portion and on the fourth fin.

20. The semiconductor device of claim 19, wherein the first height is different from a fourth height from the substrate to the upper surface of the third portion.

* * * * *